US006947509B1

(12) United States Patent
Wong

(10) Patent No.: US 6,947,509 B1
(45) Date of Patent: Sep. 20, 2005

(54) OVERSAMPLED FILTER BANK FOR SUBBAND PROCESSING

(75) Inventor: Douglas Wong, San Diego, CA (US)

(73) Assignee: Verance Corporation, San Diego, CA (US)

(*) Notice: Subject to any disclaimer, the term of this patent is extended or adjusted under 35 U.S.C. 154(b) by 0 days.

(21) Appl. No.: 10/148,161

(22) PCT Filed: Nov. 30, 1999

(86) PCT No.: PCT/US99/28343

§ 371 (c)(1),
(2), (4) Date: May 28, 2002

(87) PCT Pub. No.: WO01/41320

PCT Pub. Date: Jun. 7, 2001

(51) Int. Cl.⁷ .............................................. H04B 1/10

(52) U.S. Cl. ..................................... 375/350; 708/300

(58) Field of Search ............................... 375/229, 230, 375/232, 235, 260, 350; 382/248; 704/203, 704/205, 500; 708/203, 300, 308, 319, 322, 708/323

(56) References Cited

U.S. PATENT DOCUMENTS

| | | | |
|---|---|---|---|
| 4,691,292 A | | 9/1987 | Rothweiler ................. 708/316 |
| 5,297,557 A | * | 3/1994 | Reichl ........................ 600/520 |
| 5,568,142 A | | 10/1996 | Velazquez et al. .......... 341/126 |
| 5,732,189 A | | 3/1998 | Johnston et al. ............ 704/230 |
| 5,745,392 A | | 4/1998 | Ergas et al. ................. 708/203 |

OTHER PUBLICATIONS

Smith, M.J.T. et al., "Analysis/Synthesis Techniques for Subband Image Coding," IEEE Transactions on Acoustics, Speech, and Signal Processing, Aug. 1990, vol.38, No. 8, pp. 1446-1456.

Ramstad, T.A. et al., "Cosine-Modulated Analysis-Synthesis Filterbank with Critical Sampling and Perfect Reconstruction," IEEE International Conference on Acoustics, Speech, and Signal Processing, ICASSP-91, 1991, vol. 3, pp. 1789-1792.

Brennan, Robert, et al., "A Flexible Filterbank Structure for Extensive Signal Manipulations in Digital Hearing Aids," IEEE, 1998.

Harteneck, M., et al., "A Filterbank Design for Oversampled Filter Banks without Aliasing in the Subbands," TFTS 97, Aug. 27-29, 1997, Warwick, UK.

* cited by examiner

Primary Examiner—Chieh M. Fan
(74) Attorney, Agent, or Firm—Lipsitz & McAllister, LLC

(57) ABSTRACT

An oversampled filter bank structure that can be implemented using popular and efficient fast filter banks to allow subband processing of an input signal with substantially reduced aliasing between subbands. Even subbands (SB0, SB2, SB4, . . . ) of an input signal (x(n)) are frequency-shifted (212, 1012, 1012', 1012") prior to analysis filtering (214, 214', 214") at a 2× oversampled filter bank, subband processing (240, 240', 240"), and synthesis filtering (216, 216', 216"). A subsequent frequency-shift (218, 218') returns the even subbands to their original band positions. The odd subbands (SB1, SB3, SB5, . . . ) are delayed (252) to compensate for the processing time of the frequency shifting. Separate analysis (214, 214') and synthesis (216, 216') filter banks may be provided for the even and odd subbands, or common complex analysis (284) and synthesis (286) filter banks may be used. In another embodiment, the subbands are processed in four subband paths (Paths 0, 1, 2, 3), and 4× oversampling is used. A filter bank structure (1400) for 2-D data is also provided.

32 Claims, 22 Drawing Sheets

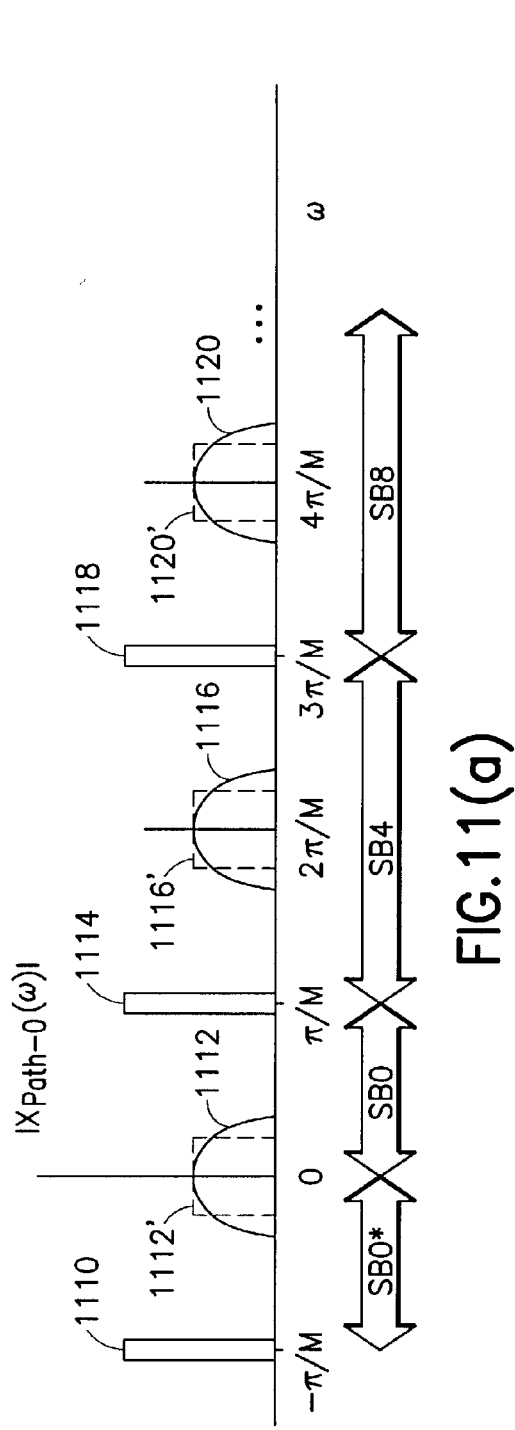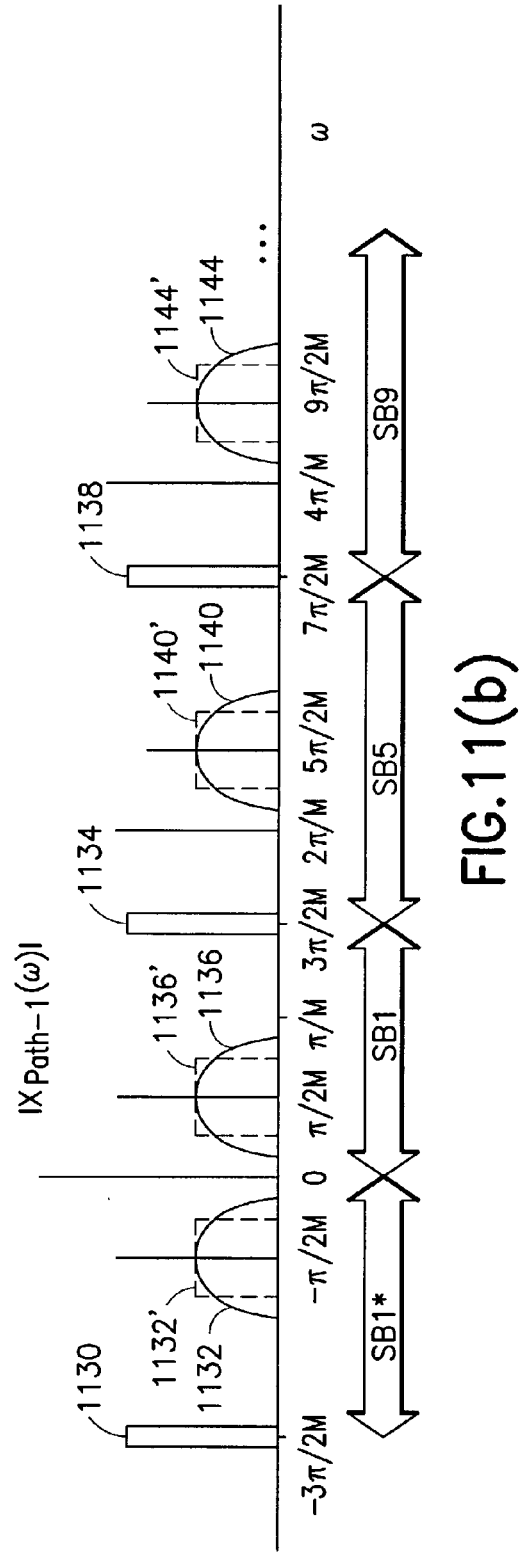
FIG.11(a)
FIG.11(b)

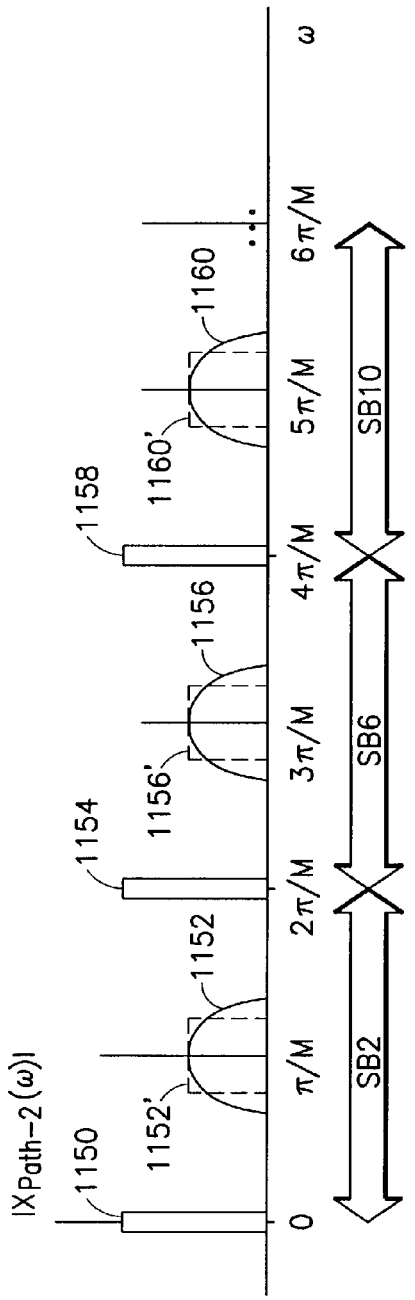
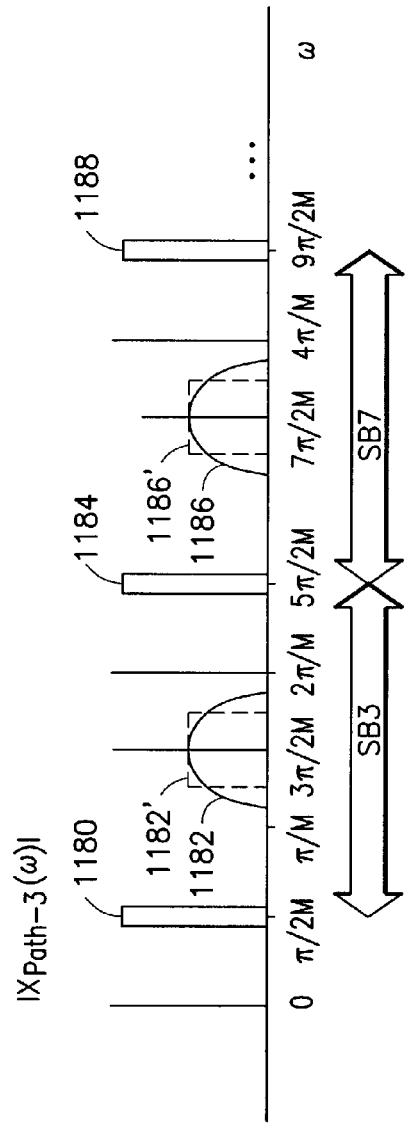

| A | B | C | D |
|---|---|---|---|
| E | F | G | H |
| I | J | K | L |
| M | N | O | P |

FIG.12(a)

PATH 3 (BOTH x AND y AXES SHIFTED BY π/M)

PATH 2 (y AXIS SHIFTED BY −π/M)

| 2,0,3 | 3,0,3 | 2,0,2 | 3,0,2 | 2,0,1 | 3,0,1 | 2,0,0 | 3,0,0 |
|---|---|---|---|---|---|---|---|
| 0,0,3 | 1,0,3 | 0,0,2 | 1,0,2 | 0,0,1 | 1,0,1 | 0,0,0 | 1,0,0 |
| 2,1,3 | 3,1,3 | 2,1,2 | 3,1,2 | 2,1,1 | 3,1,1 | 2,1,0 | 3,1,0 |
| 0,1,3 | 1,1,3 | 0,1,2 | 1,1,2 | 0,1,1 | 1,1,1 | 0,1,0 | 1,1,0 |
| 2,2,3 | 3,2,3 | 2,2,2 | 3,2,2 | 2,2,1 | 3,2,1 | 2,2,0 | 3,2,0 |
| 0,2,3 | 1,2,3 | 0,2,2 | 1,2,2 | 0,2,1 | 1,2,1 | 0,2,0 | 1,2,0 |
| 2,3,3 | 3,3,3 | 2,3,2 | 3,3,2 | 2,3,1 | 3,3,1 | 2,3,0 | 3,3,0 |
| 0,3,3 | 1,3,3 | 0,3,2 | 1,3,2 | 0,3,1 | 1,3,1 | 0,3,0 | 1,3,0 |

1385, FREQUENCY REGION NOT COVERED BY PATHS 0-3

OVERSAMPLED FILTER BANK FOR SUBBAND PROCESSING

This application is a 35 U.S.C. 371 application of PCT/US99/28343, filed on Nov. 30, 1999.

BACKGROUND OF THE INVENTION

The present invention relates to a filter bank for use in digital signal processing, and in particular, to an efficient filter bank structure that uses oversampling and separate odd and even subband processing paths to reduce aliasing between subbands.

The digital filter bank is an enabling technology for modern audio and video processing systems, and, more recently, digital data communication systems such as Orthogonal Frequency-Division Multiplexing (OFDM). FIG. 1 illustrates a typical conventional filter bank structure. A circuit 100 processes an input digital signal x(n) in N separate paths. An analysis filter bank 120 includes respective analysis filters that decompose and transform the input signal x(n) into its frequency-domain subband components xb(0), . . . ,xb(N−1) according to respective transfer functions H(0), H(1) . . . H(i), . . . H(N−1). The subband components can be processed by distinct subband processors SB(0), SB(1) . . . SB(i), . . . , SB(N−1) of a subband processor 140 to be transformed into respective components yb(0), yb(1) . . . , yb(i), . . . , yb(N−1). Various types of subband processing can be performed.

A synthesis filter bank 160 reassembles and transforms the processed components into an output signal y(n) using synthesis filters F(0), F(1), F(i), . . . F(N−1).

Many text books provide a good introduction to the theory of digital filter banks.

Of particular interest is the class of critically-sampled uniform filter banks, which have found wide application in the areas of audio and video processing. For example, the DCT (Discrete Cosine Transform) is used in the MPEG-2 video compression engine, whereas TDAC (Time Domain Aliasing Cancellation) and Cosine-modulated filter banks have been standardized into the MPEG-2 audio compression algorithms and Dolby Lab's™ AC3 compression algorithm.

While the efficiency of these filter banks makes them suitable for many signal processing applications, they suffer from aliasing between the subbands. Most practical filters have finite rejection at the Nyquist frequency so the signals beyond the Nyquist frequency are not sufficiently attenuated prior to downsampling, and appear as aliased components in the downsampled signal. Most of these filter banks are designed to be "aliasing canceling", which means that the synthesis filter bank is specifically designed to account for, and cancel, the aliasing caused by the analysis filter banks. However, this cancellation property severely constrains the kind of processing that can be introduced by the subband processors SB(0), . . . , SB(N−1). For example, a gain factor applied to one of the subband processors SB(i) will cause aliasing in the neighboring subbands, SB(i−1) and SB(i+1), during synthesis. This makes the use of such filter banks unsuitable for applications such as subband equalizers or noise shaper.

To reduce aliasing, a higher order filter can be used. However, this decreases the temporal resolution of the filter banks as well as the computational efficiency since additional calculations are required.

Another approach is to try to avoid the aliasing in the first place, by oversampling the subband components of interest. However, aliasing is still present between the subbands unless the oversampling ratio approaches the number of subbands M. This approach also is not computationally efficient.

Accordingly, it would be desirable to provide a filter bank structure for subband processing that avoids constraining the type of subband processing, is computationally efficient, avoids aliasing between subbands, can be implemented using fast filter banks, and which has a relatively low filter order, and good temporal response and stop band rejection.

The filter bank structure should be suitable for use with any type of digital input signal, including one-dimensional signals such as audio signals, and two-dimensional signals such as video signals, and should allow any type of subband processing, including embedding of auxiliary data, noise shaping, and equalizing.

The filter bank structure should allow the use of real or complex filter banks.

The present invention provides a filter structure having the above and other advantages.

SUMMARY OF THE INVENTION

The present invention relates to an oversampled filter bank structure for subband processing that can be implemented using popular fast filter banks, such as FFT and cosine-modulated filter banks. Advantageously, aliasing between subbands is substantially reduced, thus allowing independent processing of the subband signals. Also, the filter design criteria is significantly relaxed, thus resulting in a lower prototype filter order, better temporal response and higher stop band rejection.

In a particular embodiment, a digital filter apparatus processes an digital input signal to provide a corresponding output signal in which subband processing has been performed. A first frequency shifter frequency-shifts a first plurality of subbands of the digital input signal (such as the even subbands SB0, SB2, . . . ) to provide frequency-shifted subbands. An oversampled analysis filter bank means filters the frequency-shifted subbands, along with a second plurality of subbands of the digital input signal (such as the odd subbands SB1, SB3, . . . ), according to an oversampling ratio that is selected to reduce aliasing between adjacent ones of the frequency-shifted subbands, and between adjacent ones of the second plurality of subbands.

The oversampling ratio may be 2:1.

The oversampled analysis filter bank means may be implemented as a comb filter bank.

The first frequency shifter provides a $\pi/M$ radian frequency shift, where M is the total number of subbands output from the analysis filter bank means. Preferably, $M \geq 8$.

The oversampled analysis filter means may be implemented as separate real filters for processing the even and odd subbands separately in parallel paths, or as a single complex filter bank which processes the even and odd subbands together. The filter banks may be M/2-band filter banks.

In any case, a delay is provided for delaying the second plurality of subbands to compensate for a delay of the first frequency shifter.

The frequency shifter may be implemented using a critically-sampled cosine-modulated filter bank, or a Hilbert transformer, for example.

A subband processor may be provided for processing the frequency-shifted subbands and the second plurality of subbands after filtering thereof. The subband processing may involve any known technique, such as embedding of auxiliary data, noise shaping and so forth.

After subband processing, an oversampled synthesis filter means is provided for filtering the frequency-shifted subbands (e.g., even subbands) and the second plurality of subbands (e.g., odd subbands) after processing thereof at the subband processor.

A second frequency shifter shifts the already frequency-shifted subbands after filtering thereof at the synthesis filter means in a shift direction opposite to a shift direction of the first frequency shifter. Moreover, a second delay delays the second plurality of subbands to compensate for a delay of the second frequency shifter.

Subsequently, a combiner combines all subbands to provide a digital output signal corresponding to the digital input signal.

Analogous to the analysis filter bank means, the synthesis filter bank means may include separate real oversampled synthesis filter banks for the even and odd subbands, or a single complex synthesis filter bank.

Importantly, when the frequency shifters use cosine-modulated analysis and synthesis filter banks, proper frequency axis reversal is applied to each subband to maintain the orientation of the subband data.

Also, in the frequency shifter, to avoid discarding data from the highest even subband at the analysis filter of the frequency shifter, a frequency rotation scheme can be used where this data is fed to the lowest subband of the synthesis filter of the frequency shifter.

In an optional embodiment, a digital filter apparatus provides 4× oversampling to further reduce the likelihood of aliasing. An input signal is processed in four parallel paths, three of which include frequency shifters for providing shifts of $_\pi/M$, $_\pi/2M$, and $-_\pi/2M$ radians, and one of which includes a delay for compensating for a processing time of the frequency-shifters.

The four sets of subbands are processed at an over-sampled analysis filter bank means with an oversampling ratio (e.g., 4:1) that is selected to reduce aliasing between adjacent subbands in each set.

In a further optional embodiment, filtering of two-dimensional data is provided.

Corresponding methods are also presented.

BRIEF DESCRIPTION OF THE DRAWINGS

FIG. 11(a) illustrates the subband structure for Path 0 of the filter of FIG. 10 in accordance with the present invention.

FIG. 11(b) illustrates the subband structure for Path 1 of the filter of FIG. 10 in accordance with the present invention.

FIG. 11(c) illustrates the subband structure for Path 2 of the filter of FIG. 10 in accordance with the present invention.

FIG. 11(d) illustrates the subband structure for Path 3 of the filter of FIG. 10 in accordance with the present invention.

FIG. 12(a) illustrates an original 2-D signal (image) region with several subregions for processing in accordance with the present invention.

FIG. 13(e) provides a graphical depiction of the frequency regions that are processed in FIGS. 13(a)–13(d) in a 2-D, over-sampled filter bank in accordance with the present invention.

DETAILED DESCRIPTION OF THE INVENTION

The present invention relates to a filter bank for use in digital signal processing to prepare a signal for subband processing.

Figure 1:
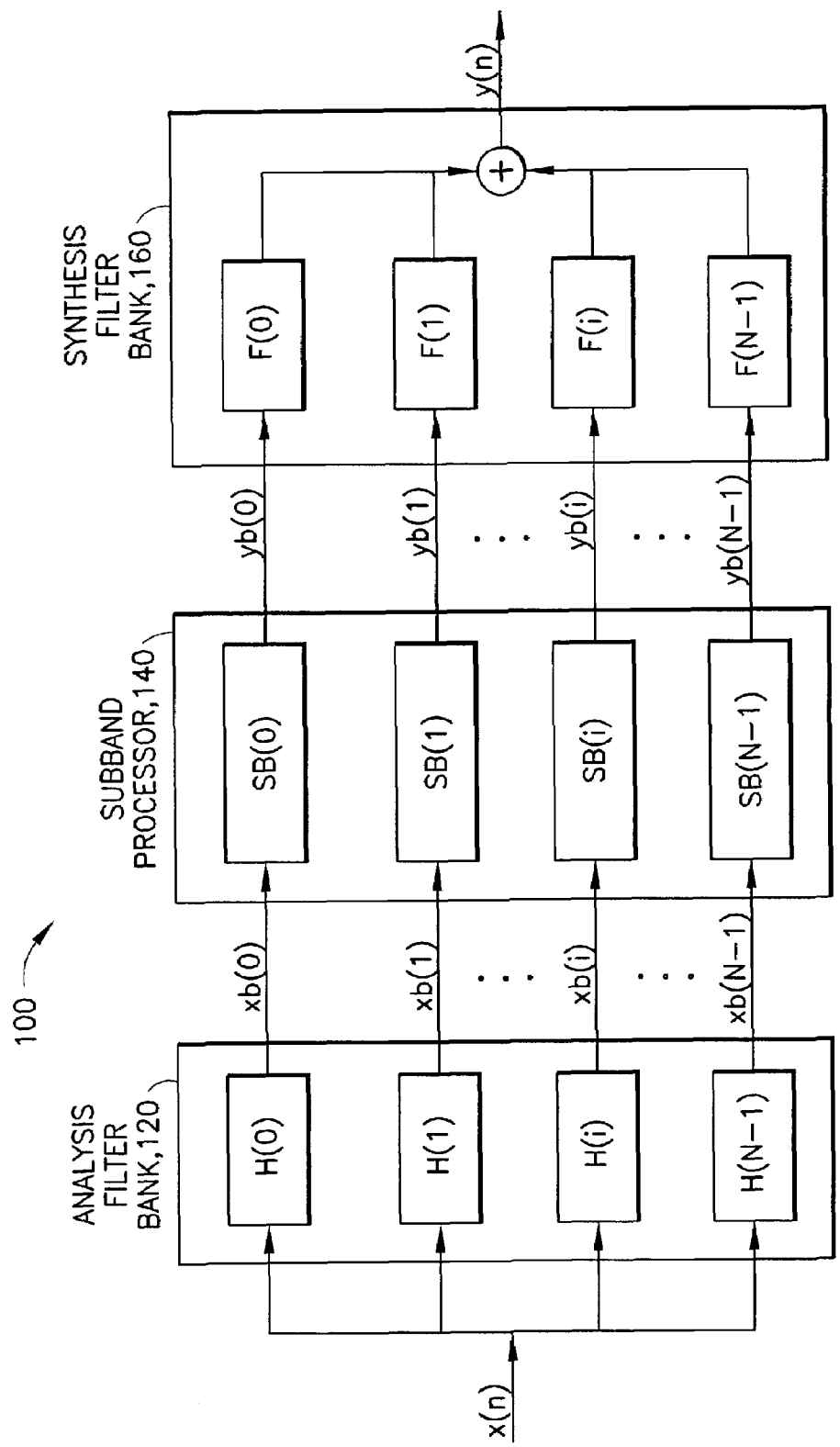
FIG. 1 illustrates a typical conventional filter bank structure.
Figure 2A:
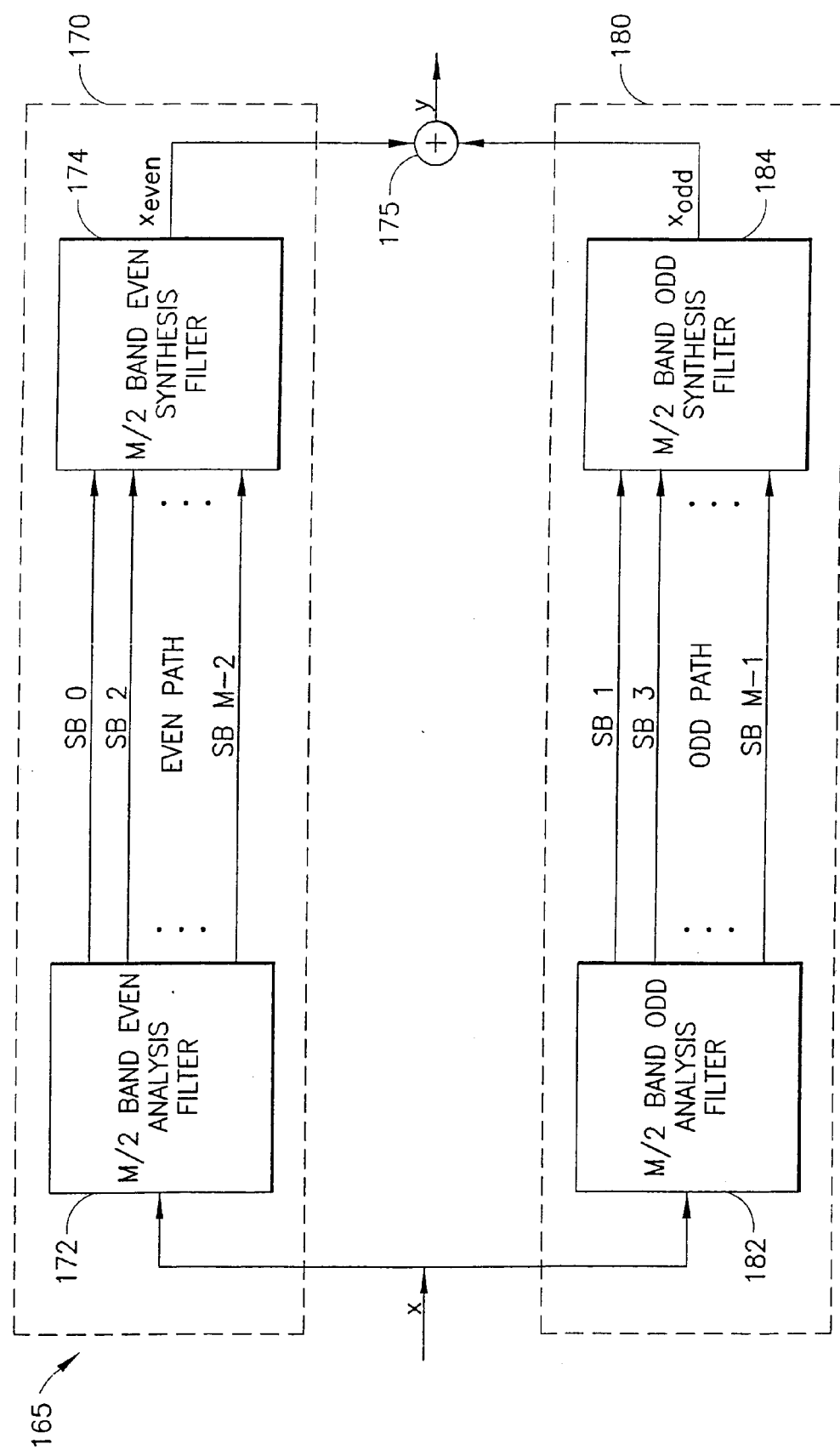
FIG. 2(a) illustrates a generalized filter structure with 2×-oversampled filter banks in odd and even subband paths in accordance with the present invention.

FIG. 2(a) illustrates a generalized filter structure with 2×-oversampled filter banks in odd and even subband paths in accordance with the present invention.

The filter apparatus 165 processes the input signal x(n) in an even subband path 170 and an odd subband path 180. The even path 170 includes an M/2-band even subband oversampled analysis filter bank 172, and an M/2-band even subband oversampled synthesis filter bank 174. Similarly, the odd path 180 includes an M/2-band odd subband oversampled analysis filter bank 182, and an M/2-band odd subband oversampled synthesis filter bank 184.

A subband processor can be provided between the filters 172 and 174, and between the filters 182 and 184.

A combiner 175 receives the output of the filter 174, $x_{even}$, and the output of the filter 184, $x_{odd}$, to provide the output signal y(n).

Figure 2B:
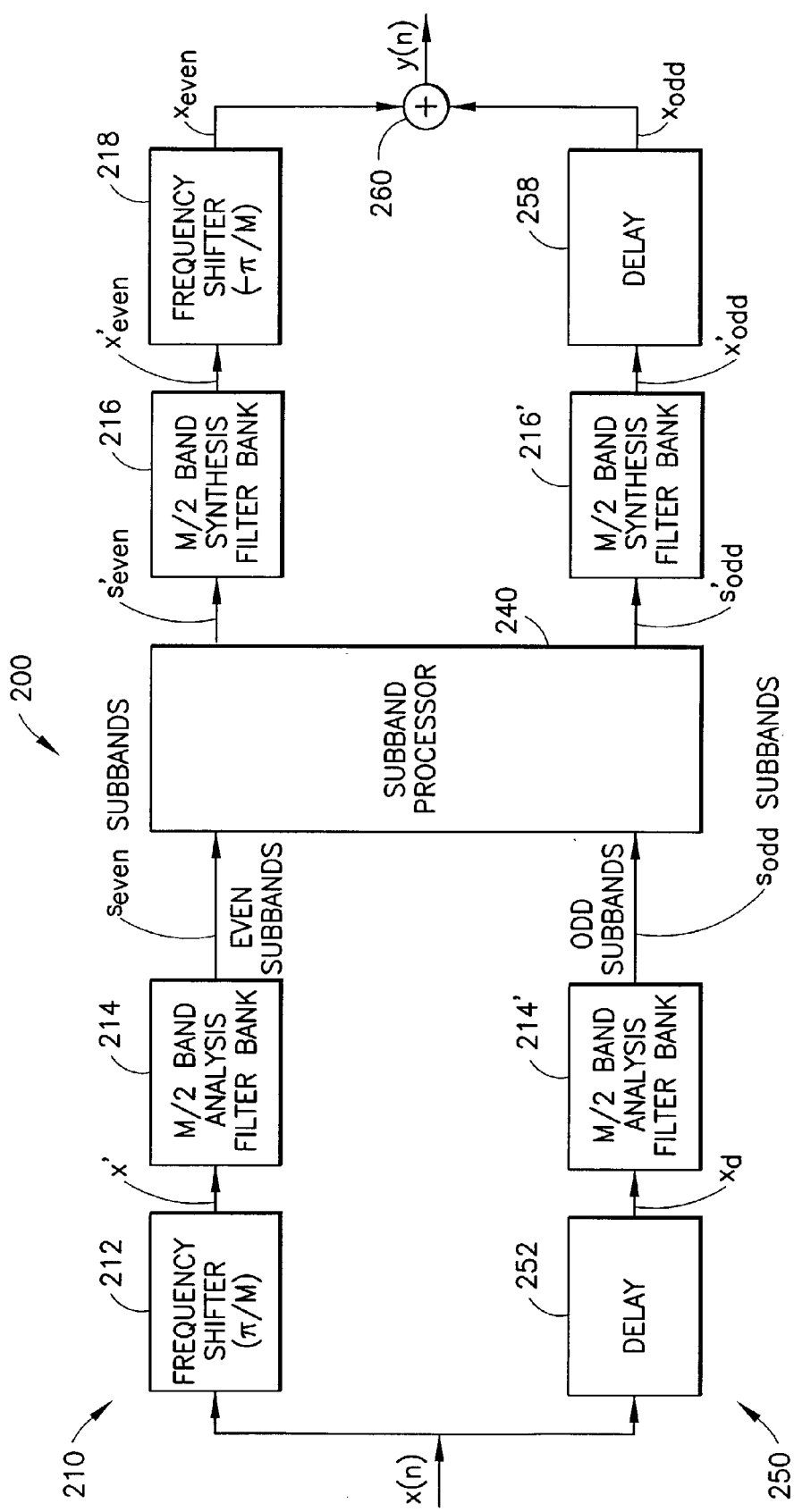
FIG. 2(b) illustrates a filter structure with 2×-oversampled real filter banks in odd and even subband paths in accordance with the present invention.

FIG. 2(b) illustrates a filter structure with 2x-oversampled real filter banks in odd and even subband paths in accordance with the present invention.

Here, a more specific implementation of the generalized structure of FIG. 2(a) is provided.

The filter apparatus 200 processes the input signal x(n) in an even subband path 210 and an odd subband path 250. The even path 210 includes a $\pi/M$ frequency shifter 212 and an M/2-band oversampled analysis filter bank 214. The odd path 250 includes a delay 252, which compensates for the processing time of the frequency shifter 212, and an M/2-band oversampled analysis filter bank 214', which is the complement of the filter bank 214.

A subband processor 240 receives the respective even and odd subband data, $s_{even}$ and $s_{odd}$, respectively, of the input signal x(n) from the filters 214 and 214', respectively. The subband processing can include providing auxiliary data in each subband, harmonic analysis/synthesis as used in pitch-preserving time compression/expansion of audio, audio compression, and OFDM and transmultiplexers (transcoding multiplexers) as used in digital communications. For example, advantageous subband processing techniques are disclosed in commonly-assigned U.S. Pat. Nos. 5,822,360 and 5,937,000. The E-DNA® data processing system of Solana Technology Development Corporation, San Diego, Calif., USA, is an example of such technology.

The even and odd subbands may be processed using separate and/or common circuitry at the subband processor 240.

The data output from the subband processor 240 in the even path 210, $s_{even}'$, is provided to an M/2-band synthesis filter bank 216 that is properly matched to the analysis filter bank 214, and a $-\pi/M$ frequency shifter 218. The data output from the subband processor 240 in the odd path 250, $s_{odd}'$ is provided to an M/2-band synthesis filter bank 216' that is properly matched to the analysis filter bank 214', and a delay 258, which compensates for the processing time of the frequency shifter 218.

A combiner 260 receives $x_{even}$ and $x_{odd}$ to provide the final output signal y(n).

Note that the frequency shifting is provided in the even subband path to allow the use of fast filter banks. Without this frequency shifting, the downsampling edges would land on the center of the passband of interest.

Additionally, while the frequency shifter 212 is shown as an upshifter and the frequency shifter 218 is shown as a downshifter, the opposite may be used.

M/2 is the downsampling ratio at the filters 214 and 214', and the upsampling ratio at the filters 216 and 216'. M is the total number of subbands output from the analysis filter banks 214 and 214' together when 2x oversampling is used.

M=32 (M/2=16) has been used satisfactorily by the present inventors. M should preferably be selected as a multiple of two to allow the use of efficient algorithms, such as the DFT and FFT, in the filter implementation. For practical purposes, M=8 as a minimum. The efficiency of the fast filter banks does not become substantial unless M>>$\log_2$(M).

Figure 2C:
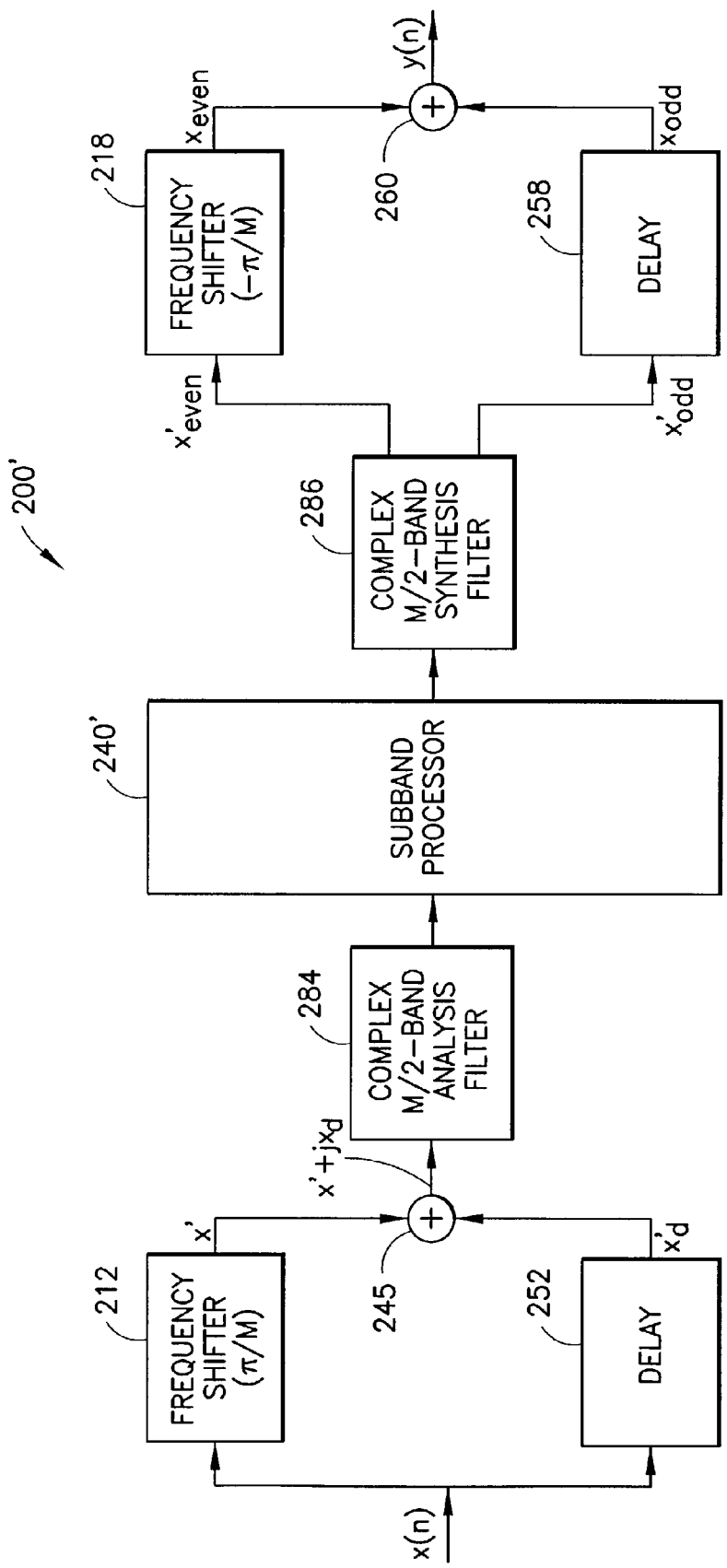
FIG. 2(c) illustrates a filter structure with a 2×-oversampled complex filter bank in accordance with the present invention.

FIG. 2(c) illustrates a filter structure with a 2x-oversampled complex filter bank in accordance with the present invention.

Like-numbered elements correspond to one another in the figures. Additionally, the prime symbol (ex: 200') denotes related elements.

Here, a single complex M/2-band analysis filter bank 284 is used instead of having separate filter banks for the odd and even subbands. A combiner 245 combines the even subband data x' with the delayed, odd subband data $x_d$ to form the complex value $x'+jx_d$.

After subband processing at the processor 240', a corresponding synthesis filter 286 is used to recover the even subband data $x_{even}'$ and odd subband data $x_{odd}'$.

In FIGS. 2(b) and 2(c), note that $x_{even}'$ and $x_{odd}'$ are full-band data signals, whereas $s_{even}'$ and $s_{odd}'$ are subband data signals.

The subband processing is the same in both processors 240' and 240.

Figure 3A:
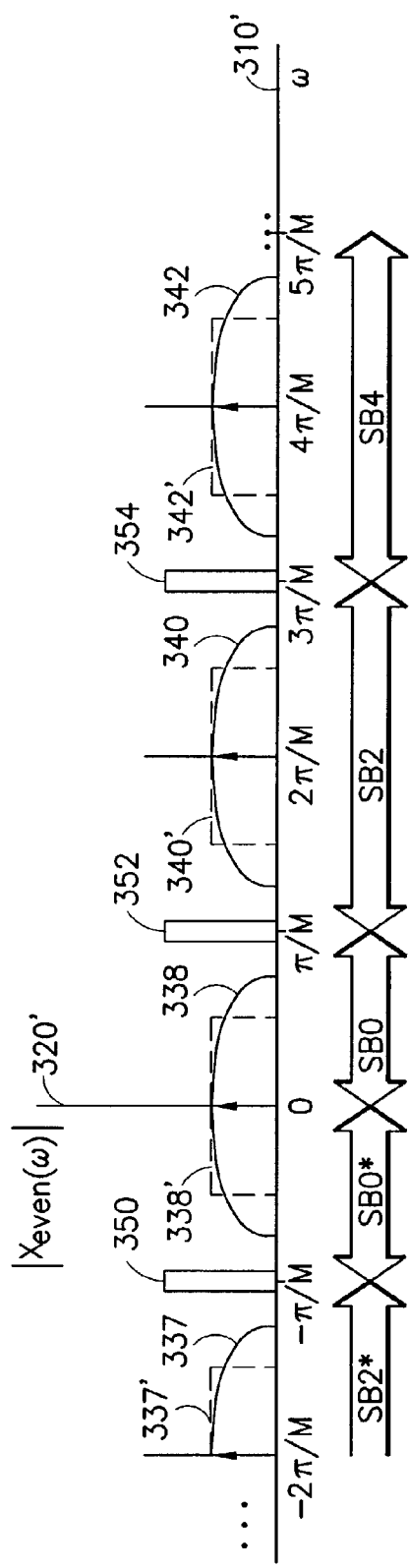
FIG. 3(a) illustrates the spectrum for even subbands in accordance with the present invention.

FIG. 3(a) illustrates the subband spectrum for even subbands in accordance with the present invention.

A horizontal axis 310' denotes frequency, $\omega$, while a vertical axis 320' denotes the magnitude of the spectrum $X_{even}(\omega)$ of the even subband values just prior to recombining with the odd subband values to form the output signal y(n).

The end-to-end filter response or transfer function is $X_{even}(\omega)/X(\omega)$ using the notation of FIGS. 2(a)–2(c).

SB0, SB2 and SB4 denote the zeroeth, second and fourth subbands respectively. SB0 extends between 0 and $\pi/M$, while its complex conjugate, SB0*, extends from $-\pi/M$ to 0. SB2 extends between $\pi/M$ and $3\pi/M$, and SB3 extends between $3\pi/M$ and $5\pi/M$. SB2* extends between $-\pi/M$ and $-3\pi/M$, although part of it is not shown.

The actual passbands of the even subbands are shown at 337, 338, 340 and 342, while the corresponding idealized passbands, having a width of $\pi/M$, are shown at 337', 338', 340' and 342', respectively.

Figure 3B:
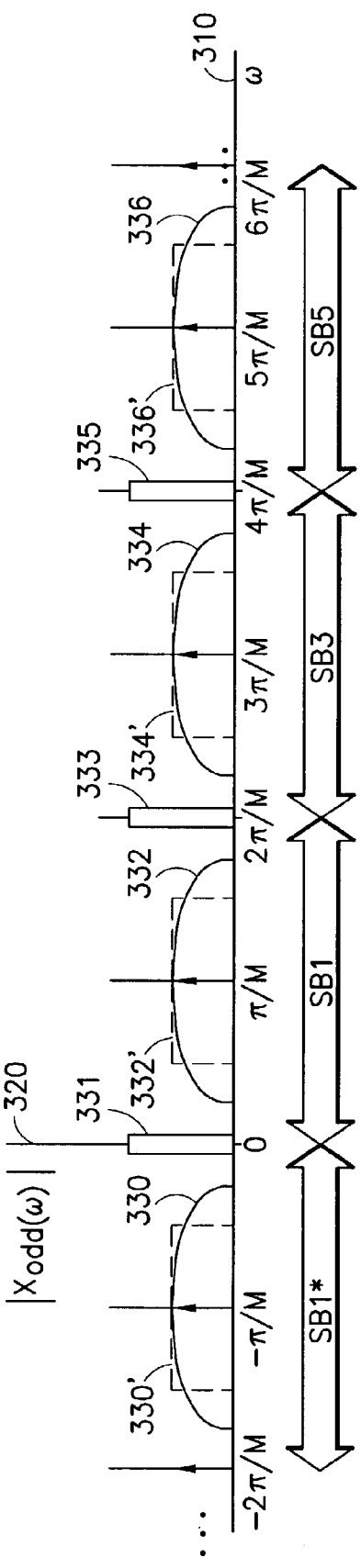
FIG. 3(b) illustrates the spectrum for odd subbands in accordance with the present invention.

FIG. 3(b) illustrates the subband spectrum for odd subbands in accordance with the present invention.

A horizontal axis 310 denotes frequency, $\omega$, while a vertical axis 320 denotes the magnitude of the spectrum $X_{odd}(\omega)$ of the odd subband values just prior to recombining with the even subband values to form the output signal y(n). The end-to-end response or transfer function is $X_{odd}(\omega)/X(\omega)$ using the notation of FIGS. 2(a)–(c).

SB1, SB3 and SB5 denote the first, third and fifth subbands, respectively. For example, SB1 extends between 0 and $2\pi/M$, SB3 extends between $2\pi/M$ and $4\pi/M$, and SB5 extends between $4\pi/M$ and $6\pi/M$. SB1* denotes the complex conjugate of SB1, and extends between 0 and $-2\pi/M$. Not all subbands are shown. For example, with M/2=16, subbands SB1, SB3, SB5, SB7, SB9, SB11, SB13 and SB15 are present in the odd subband path.

The actual passbands of the odd subbands are shown at 330, 332, 334 and 336, while the corresponding idealized passbands, having a width of $\pi/M$ and a sharp cut-off response, are shown at 330', 332', 334', and 336', respectively.

Referring to FIGS. 3(a) and 3(b), there are two important points to note. First, unlike the critically-sampled counterpart, the pass bands 330, 332, 334, 336, 338, 340, 342, . . . of the oversampled subbands SB1*, SB1, SB3, SB5, SB0, SB2 and SB4, . . . , respectively, occupy less than the available bandwidth, $2\pi/M$. In contrast, a critically-sampled signal utilizes the entire subband bandwidth.

With the present invention, each subband has very little signal energy around its band edges 331, 333, 335, 350, 352, 354 . . . Therefore, little or negligible aliasing between subbands is introduced by the filter banks 214, 214' and 284.

The oversampling ratio is determined by the ratio of the available bandwidth to the utilized passband, and is usually chosen to be two to minimize computation and implementation complexity, although other ratios can be used.

Second, each of the subband paths 210, 250 has only M/2 subbands, but when we combine the two paths, there are a total of M subbands (output from the filter bank 284), which cover the full bandwidth of the signal space, and thus the filters 200 or 200' overall each comprise an M-band oversampled filter bank.

Referring again to FIG. 2(b), in the one-dimensional (1-D) filter 200, the analysis filter banks 214, 214' are complements of one other, as are the synthesis filter banks 216, 216'. For the 1-D oversampled filter banks, the following design considerations should be taken into account. Namely, the difference in band alignment in the even and odd subband paths implies that two different filter banks need to be realized. Moreover, the even subband path is not easily realizable conventionally, since the subband centers are at multiples of $\pi/M$, which is where the downsampling/aliasing occurs with most fast filter banks algorithm.

However, the 2× oversampled filter banks of FIGS. 2(b) and 2(c) solve the aforementioned problems. In particular, the M/2 samples of x(n) are replicated in two paths, with one path (even path 210) going to the frequency shifter 212 of $\pi/M$ radians, and the other path (odd path 250) going through the delay line 252, which compensates for the delay introduced by the frequency shifter 212.

Two sets of identical oversampled M/2-band analysis filter banks 214, 214' are used for decomposing the even and odd sequences. For M/2 time domain samples, this results in 2*M/2=M subband samples total.

After the subband processing at the subband processor 240, the subbands samples are reassembled/synthesized into the odd and even time-domain sequences with M/2 samples using two sets of identical oversampled M/2-band synthesis filter banks 216, 216'.

The synthesized even sequence is frequency shifted back by $-\pi/M$ radians at the shifter 218. The synthesized odd sequence is delayed at the delay 258 to align with the even path 210.

The odd and even sequences are added together at the combiner 260 to form M/2 time domain samples, y(n). Note that x(n) consists of a sequence of M/2 samples, for which there will be a corresponding M/2 samples of y(n), which is the reconstructed version of x(n). Oversampling occurs since M/2 samples of x(n) are transformed into M samples of $s_{even}$ and $s_{odd}$ combined in the subband domain. Thus, the transformation is considered to be over-complete since it uses more samples than is fundamentally necessary to represent the original sequence.

The frequency shifters 212, 218 can be realized in a variety of ways, as discussed below.

Figure 4A:
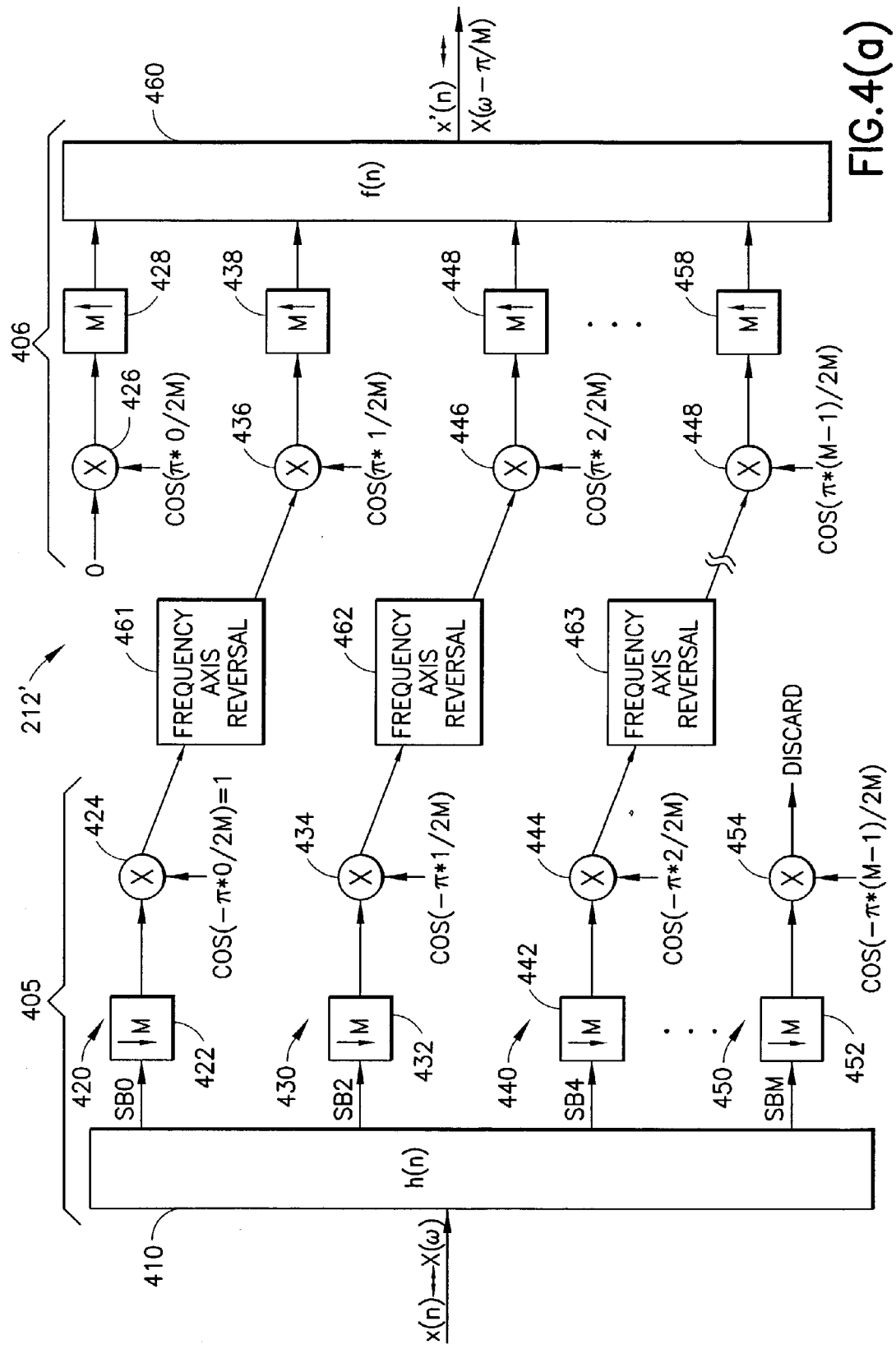
FIG. 4(a) illustrates a critically-sampled cosine-modulated frequency upshifter in accordance with the present invention.

FIG. 4(a) illustrates a critically-sampled cosine-modulated frequency upshifter in accordance with the present invention.

The frequency upshifter 212' receives the input signal x(n), having the spectral representation $X(\omega)$, and outputs the signal x'(n), having the spectral representation $X'(\omega)=X(\omega-\pi/M)$.

This approach to frequency shifting uses an M-band (or multiple thereof) cosine-modulated filter bank to perform the frequency shifting. At an analysis filter portion 405 of the frequency shifter 212', a time-domain transfer function h(n) 410 decomposes the time sequence x(n) into M subband samples, e.g., in paths 420, 430, 440, ..., 450. For example, SB0 data is provided in path 420, SB2 data is provided in path 430, and so forth.

In each path, the subband samples are downsampled by a factor of M at a corresponding downsampler 422, 432, 442, ..., 452, and cosine-modulated at a corresponding modulator 424, 434, 444, ... 454.

The samples from the last (Mth) subband (cosine modulation index M−1) in path 450 are discarded. This is acceptable for many applications, such as wide-band audio applications, because the last subband usually contains noise with little signal energy. For example, if an audio signal having a spectrum from 0 to 24 KHz is represented by M=32 subbands, the last band that is discarded has components near 24 KHz, which do not carry significant information for the human listener. Moreover, the discarded subband provides a guard band that can avoid channel interference.

However, if desired, a frequency rotation scheme can be employed where the highest subband output from the analysis filter 405, in path 450 is fed to the modulator 426 of the lowest subband of the synthesis filter 406, in path 420. All information in x(n) can therefore be retained.

The subband samples in each path are fed to the next higher subband at the synthesis filter 406 of the frequency shifter 212', and the zeroeth subband is set to zero at modulator 426. Frequency axis reversal functions 461–463 are used due to the structure of the cosine-modulated filter banks, as discussed further in connection with FIG. 4(b). Frequency axis reversal for a band-limited sequence can be expressed as:

$$x'(n)=x(n)*\exp(j*_\pi*n)$$

In an actual implementation, this is equivalent to: $x'(n)=x(n)*(-1)^n$, which flips the sign (polarity) of every other sample. This function can be incorporated into the synthesis filter bank 406, but is shown as being separate in FIG. 4(a) for clarity.

The samples of SB0, in path 420, are provided to modulator 436, in path 430. The samples of SB2, in path 430, are provided to modulator 446, in path 440, and so forth. Generally, the samples in each subband in the analysis filter bank 405 are fed to the next higher subband in the synthesis filter bank 406.

Cosine modulators 426, 436, 446, ..., 448 demodulate the subband samples from the next lower subband of the analysis filter 405 and provide them to respective upsamplers 428, 438, 448, ... 458, for upsampling by a factor of M. The resulting data is provided to a function f(n) 460, which re-assembles the samples in proper sequence to obtain the time sequence x'(n), which is shifted by $\pi/M$ radians relative to x(n). This method is fairly efficient, but the delay is limited by the delay of the M-band filter banks.

A second approach for frequency shifting uses an M-band (or multiple thereof, e.g., 2M, 3M, ...) Discrete Fourier Transform (DFT) type of filter bank such as used in Time Domain Aliasing Cancellation (TDAC). See J. P. Princen et al., *Analysis/Synthesis filter bank design based on time domain aliasing cancellation*, ASSP-34, October 1986. The structure is similar to the first approach. Specifically, this approach is slightly slower than the cosine-modulated filter bank, but has the advantage that we can choose the number of subbands without worrying about frequency reversal, discussed above.

With the second approach, we assume a N*M band TDAC filter bank, where N is an integer. To realize a frequency shift of $_\pi/M$, analysis/synthesis filters are provided back-to-back with the following relationships:

sa(0)-->ss(N)
sa(1)-->ss(N+1)
sa(2)-->ss(N+2)
:
sa(i)-->ss(N+i), where sa(i) is the analysis subband output at index i, and ss(i) is the synthesis subband input at index i.

Figure 4B:
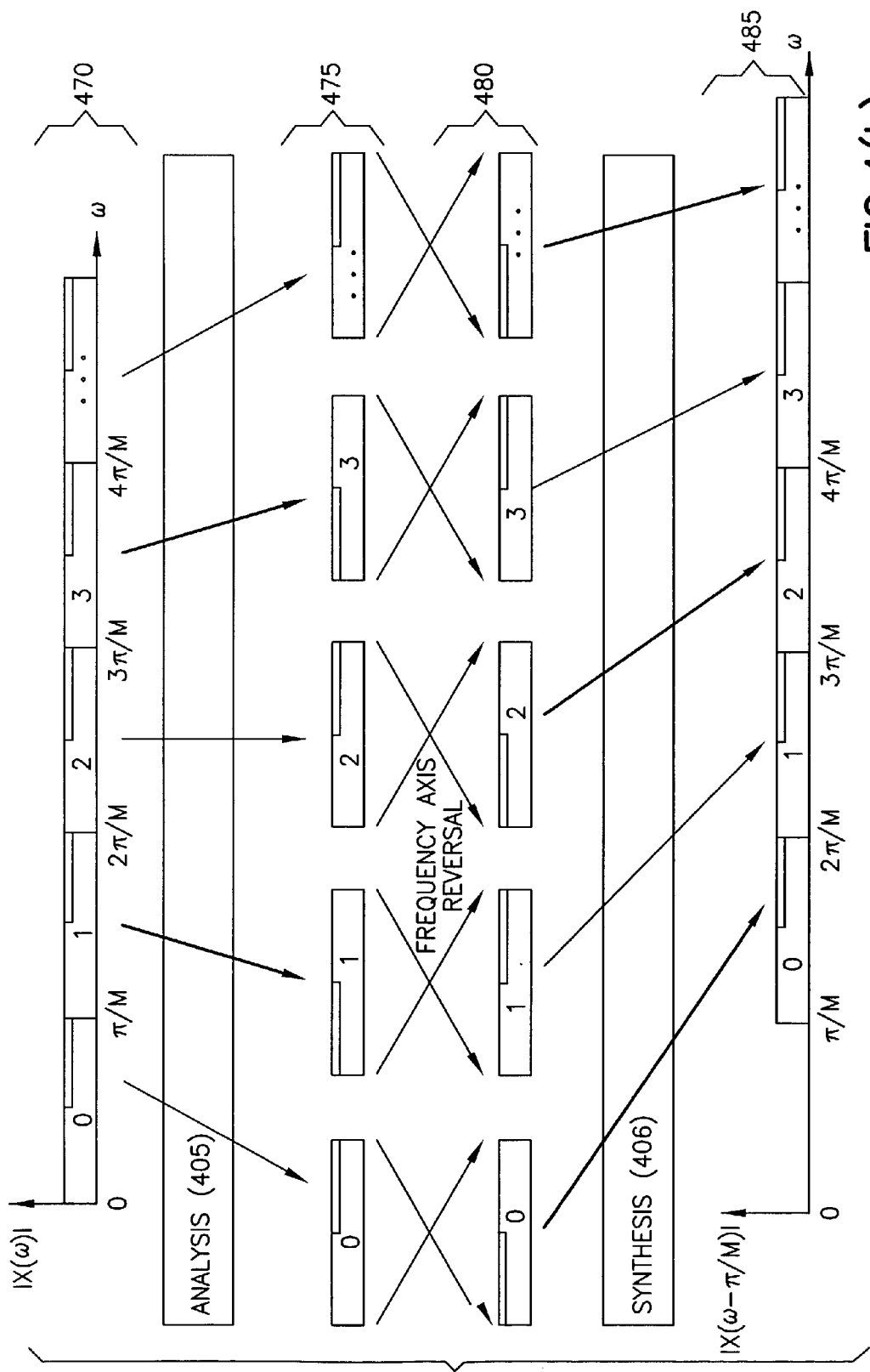
FIG. 4(b) illustrates frequency axis reversal for a frequency shifter in accordance with the present invention.

FIG. 4(b) illustrates frequency axis reversal for a frequency shifter in accordance with the present invention. Frequency axis reversal is an inherent characteristic of cosine-modulated filter banks.

The spectrum of $X(_\omega)$ is shown at 470. After processing at the analysis filter 405 of the frequency shifter 212', each (non-discarded) subband undergoes frequency axis reversal, as shown at 475. To correct this, a corresponding reversal must be implemented, as shown at 480. The corrected subbands can then be input to the synthesis filter 406 of the frequency shifter 212' to provide the frequency-shifted subbands $X(_\omega - _\pi/M)$ as shown at 480.

Essentially, a first set of every other subband output from the analysis filter bank 405 contains signals that are frequency axis flipped, i.e., $0_{\to\pi}$ and $_\pi \to 0$. A second set of the remaining alternate subbands will be frequency axis flipped after processing at the synthesis filter 406. However, by routing the subband data into the next higher subband for frequency upshifting, we are feeding non-flipped signals into the synthesis filter bank, which would attempt to flip these subband signals. Proper frequency axis reversal for each subband avoids this problem.

An analogous result is achieved for frequency downshifting, as discussed in connection with FIG. 6, with frequency axis reversal functions 661–663.

Figure 5:
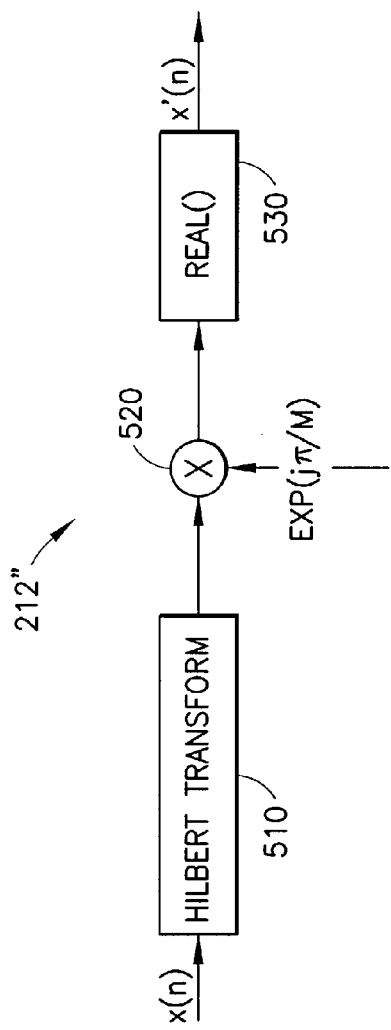
FIG. 5 illustrates a Hilbert Transform frequency shifter in accordance with the present invention.

FIG. 5 illustrates a Hilbert Transform frequency shifter in accordance with the present invention.

A third approach for implementing the frequency shifters 212 or 218 of FIGS. 2(b) and 2(c) uses a Hilbert transformer with a complex modulator. Specifically, the frequency shifter 212" includes a Hilbert Transformer 510, a complex modulator 520, and a function 530 for obtain the real portion of the output of the modulator 520.

An ideal Hilbert transformer is an all-pass filter than imparts a 90° phase shift on the input signal.

The frequency response is specified as:

$H(_\omega)=-j$ for $0<\omega \leq \pi= j$ for $-\pi<\omega<0$.

The Hilbert transformer can be implemented using a Fast Fourier Transform (FFT) or a Finite Impulse Response (FIR) filter, for example. The Hilbert transform of the sequence is then modulated with a complex modulator 520 with center frequency at $_\pi/M$, to achieve a frequency upshift. The real part of the modulated sequence represents the frequency-shifted version of the original time-domain sequence.

The frequency shifter 212" can be used to achieve a frequency downshift by using $\exp(-j_\pi/M)$ instead of $\exp(j_\pi/M)$ at the modulator 520. The input signal to the frequency shifter is then $x_{even}'(n)$, and the output signal is $x_{even}(n)$.

Figure 6:
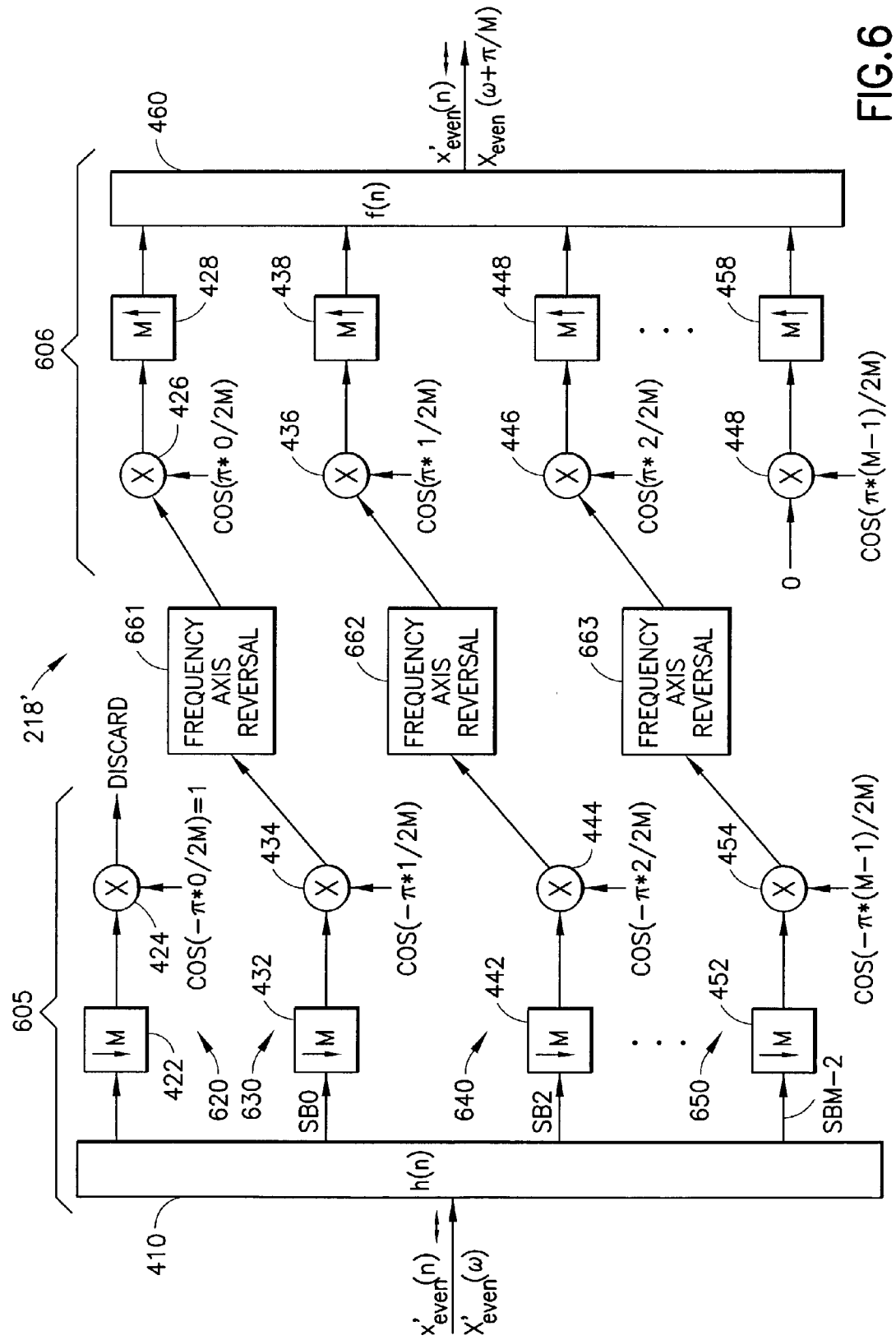
FIG. 6 illustrates a critically-sampled cosine-modulated frequency downshifter in accordance with the present invention.

FIG. 6 illustrates a critically-sampled cosine-modulated frequency downshifter in accordance with the present invention.

The frequency downshifter 218' receives the input signal $x_{even}'(n)$, having the spectral representation $X_{even}'(_\omega)$, and outputs the signal $x_{even}(n)$, having the spectral representation $X_{even}(_\omega)=X_{even}'(_\omega + _\pi/M)$.

The frequency downshifter 218', which includes subband paths 620, 630, 640, ..., 650, is analogous to the frequency upshifter 212'. An analysis filter bank 605 and synthesis filter bank 606 correspond to the analysis filter bank 405 and synthesis filter bank 406, respectively, of FIG. 4(a), except each modulator 426, 436, 446, ..., 448 receives subband samples from the next higher (instead of lower) subband from the analysis filter bank 605.

Frequency axis reversal functions 661–663 are also provided. They are analogous to the reversal functions 461–463, as discussed in connection with FIGS. 4(a) and 4(b).

Figure 7:
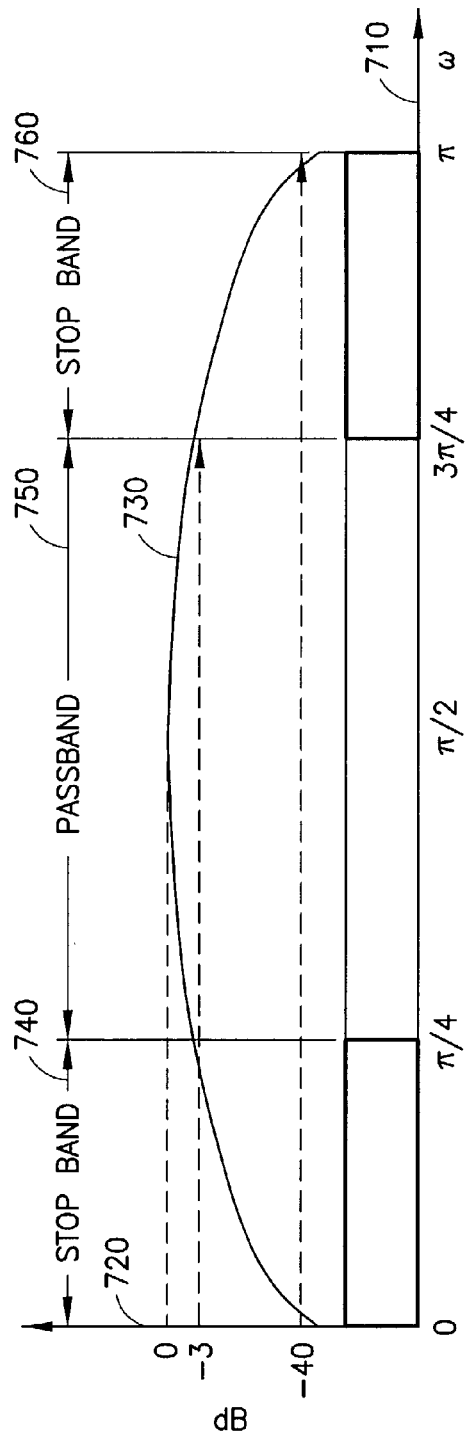
FIG. 7 illustrates a prototype filter design for analysis and synthesis filter banks in accordance with the present invention.

FIG. 7 illustrates a prototype filter design for analysis and synthesis filter banks in accordance with the present invention.

In accordance with a critical aspect of the present invention, the oversampled M/2-band filter banks 214, 214', 216 and 216', along with the complex filters 284 and 286, may be implemented as comb filters. A comb filter may be viewed as a filter in which nulls occur periodically across the frequency band. The comb filter structure of the present invention is realized using a modified form of cosine-modulated filter bank, which can be implemented with fast transforms such as the DCT or FFT. Other uniform filter banks may be used, such as a pseudo-Quadrature Mirror Filter (QMF), as described in J. H. Rothweiler, *Polyphase Quadrature Filters—A New Subband Coding Technique*, International Conference on Acoustics, Speech and Signal Processing (ICASSP), 1983. TDAC can also be used with appropriate modification.

Consider an M/2-band cosine-modulated filter bank. In a conventional, critically-sampled implementation, the prototype filter is designed to have a bandwidth of $_\pi$. In the present invention, the prototype filter is designed to have a bandwidth of $_\pi/2$. The response 730 of the corresponding comb filter is shown in FIG. 7. A horizontal axis 710 indicates frequency, while a vertical axis 720 indicates the magnitude of the response, in decibels (dB). After the cosine modulation, a series of non-overlapping band-pass filters result which have band edges at multiples of $_\pi/4$ and $3_\pi/4$, respectively. The effective bandwidth of the pass band 750 is therefore $_\pi/2$. Note that an attenuation of −40 dB can be considered to represent an amplitude of essentially zero.

The stop band rejection of the filter is designed to be low enough so that aliasing is small or negligible at 0 and $_\pi$. Stop bands 740 and 760 are provided between 0 and $_\pi/4$, and between $3_\pi/4$ and $_\pi$, respectively.

An additional benefit when designing this prototype filter is that we are no longer constrained by the severe aliasing cancellation matrix, discussed in P. P. Vaidyanathan, *Multirate System And Filter Banks*. Prentice Hall 1993, as with the critically-sampled case, thus yielding additional freedom in the design. Effectively, the filter order can be reduced substantially to provide better temporal resolution, and to achieve improved stop band rejection characteristics.

Note that the response 730 applies to both the analysis and synthesis filter banks since, in the design of a cosine-modulated filter bank, one only needs to specify the prototype filter characteristics, and the response of the analysis and synthesis filters will be dictated by the prototype filter.

Figure 8:
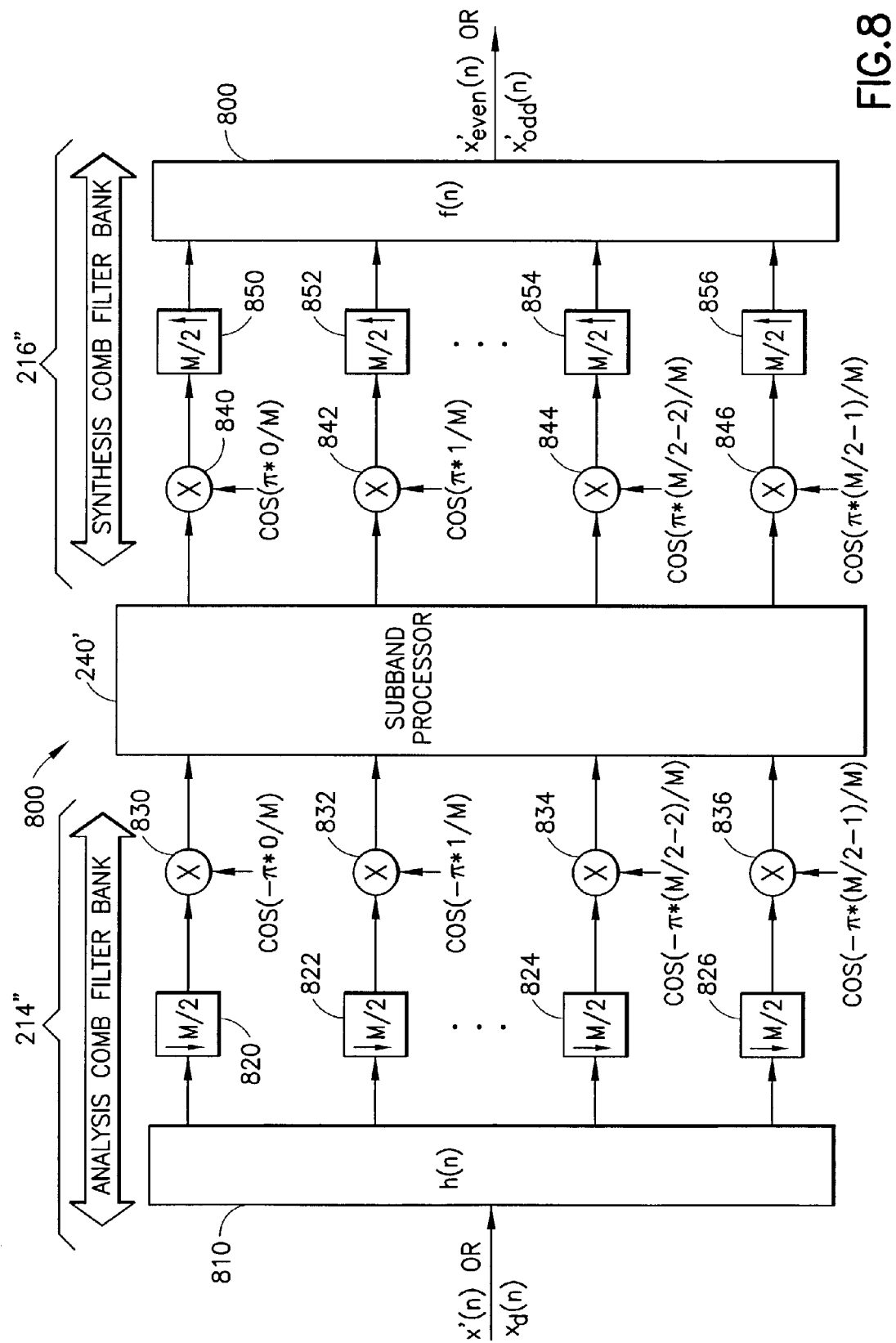
FIG. 8 illustrates a comb filter bank structure in accordance with the present invention.

FIG. 8 illustrates a comb filter bank structure in accordance with the present invention.

The circuit 800 can perform the functions of the filter 214, subband processor 240, and filter 216 of FIG. 2(b), or the filter 214', subband processor 240, and filter 216' of FIG. 2(b).

An analysis comb filter bank 214" includes a transfer function h(n) 810 for providing the input signal in M/2 subbands, downsamplers 820, 822, ..., 824, 826 for each of the M/2 even or odd subbands, and corresponding cosine modulators 830, 832, ..., 834, 836. After processing at the subband processor 240', the even or odd subband data is processed at a synthesis comb filter bank 216", which includes cosine modulators 840, 842, ..., 844, 846, corresponding M/2 upsamplers 850, 852, ..., 854, 856, and a transfer function f(n) 860 that assembles the subband data to provide the output $x_{even}'$ (n) or $x_{odd}'$ (n).

Figures 9, 9A:
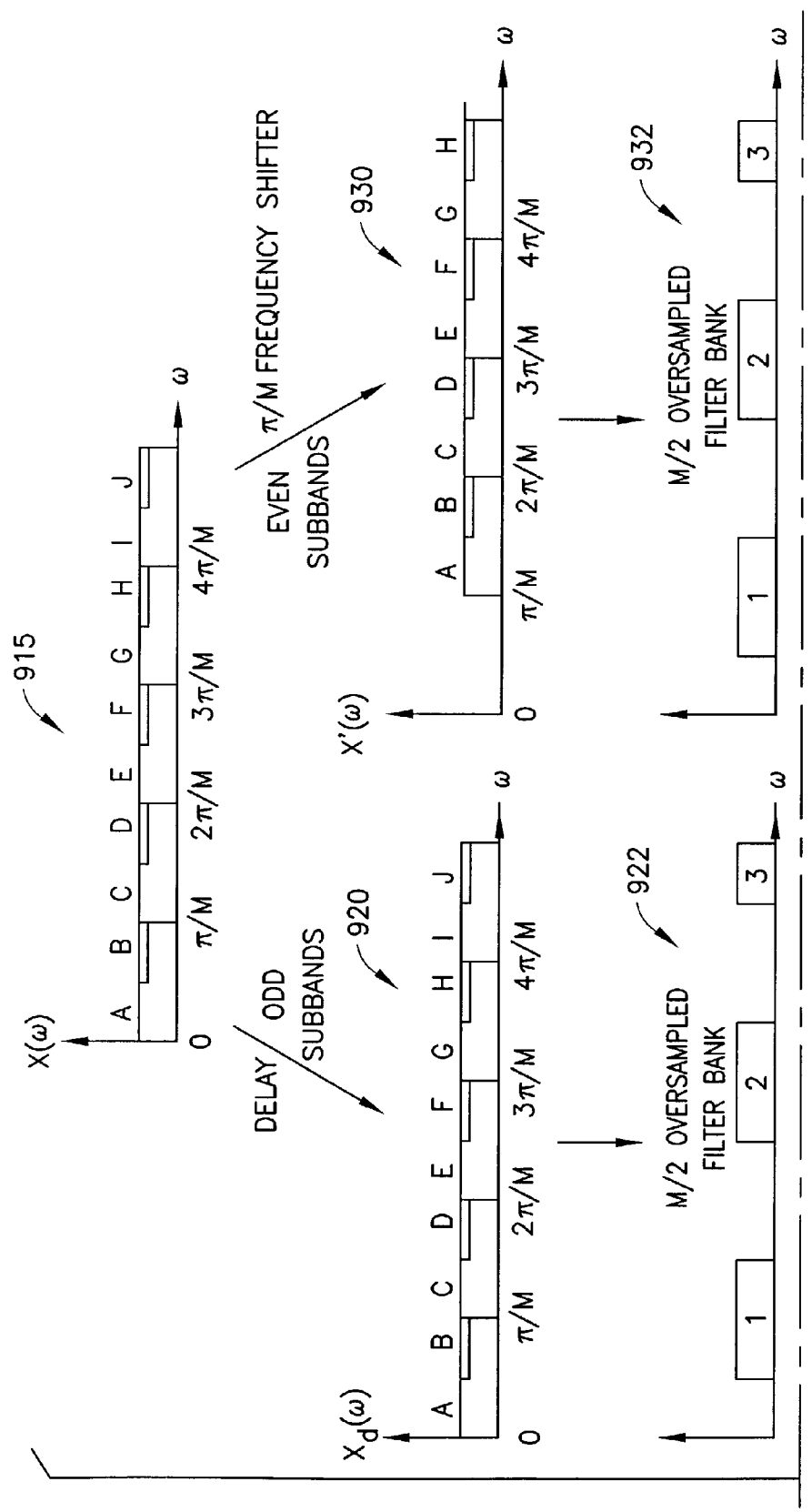
FIG. 9 illustrates a graphical realization of one-dimensional filter bank processing in accordance with the present invention.
Figure 9B:
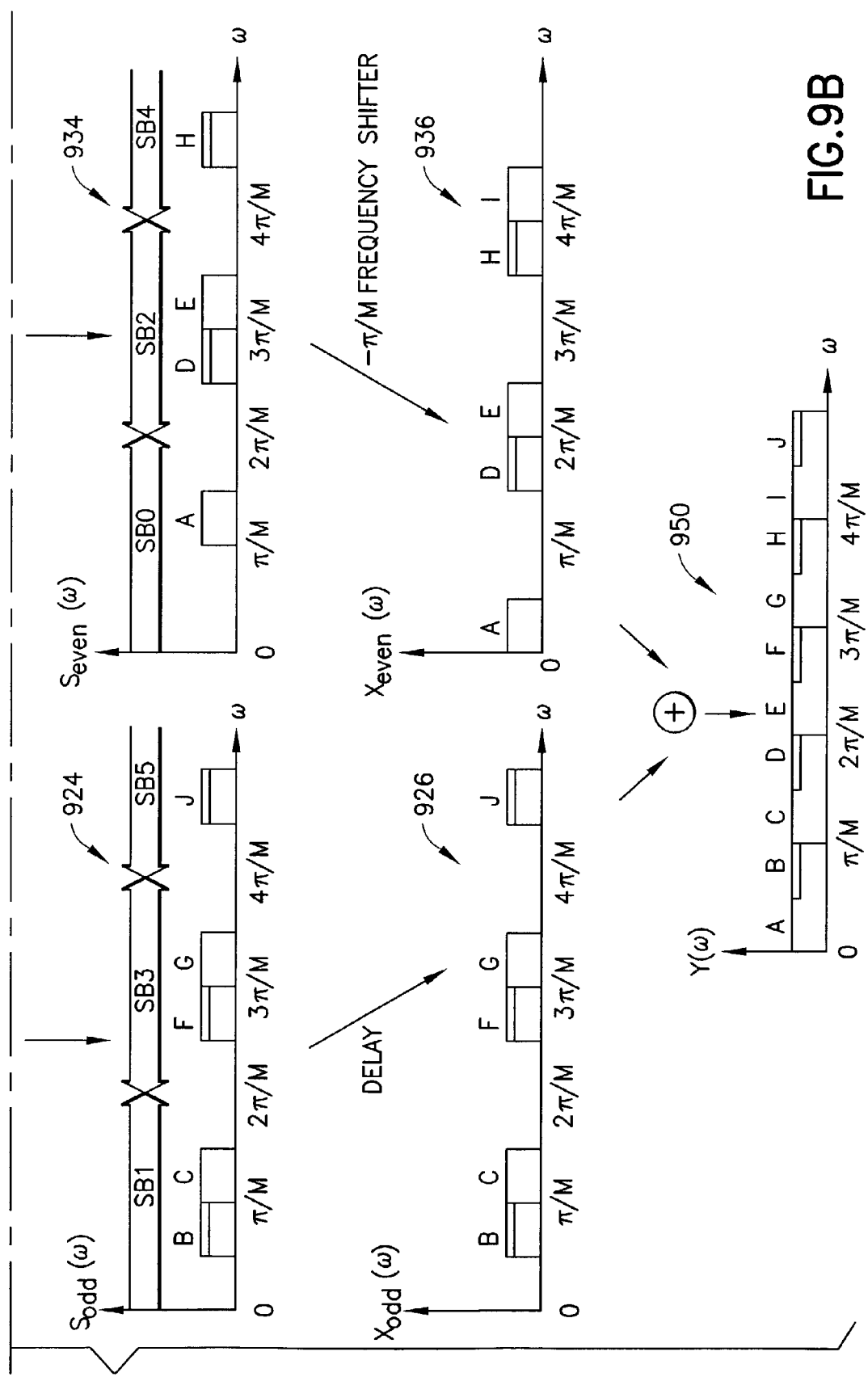

FIG. 9 illustrates a graphical realization of one-dimensional filter bank processing in accordance with the present invention.

The graphical illustration shows how the oversampled filter banks are realized with the frequency shifter and comb filter banks already discussed.

For simplicity, only a portion of the actual spectrum $X(\omega)$ (915) of the input signal x(n), i.e., from 0 to $5\pi/M$ is shown. A number of subband portions A-J are shown.

For the processing of the odd subbands, $X_d(\omega)$ (920) is formed by delaying $X(\omega)$. The passbands of the oversampled filter banks are shown at 922. The resulting odd subband samples $S_{odd}(\omega)$ (924), which includes subband portions B, C, F, G and J, occupy only one-half of the available subband width, $2\pi/M$. After a delay, $X_{odd}(\omega)$ (926) is formed, whose spectrum is essentially the same as $S_{odd}(\omega)$ (924).

For the processing of the even subbands, $X'(\omega)$ (930) is formed by frequency-shifting $X(\omega)$ by $\pi/M$. The passbands of the oversampled filter banks are shown at 932. The resulting even subband samples $S_{even}(\omega)$ (934), including subband portions A, D, E and H, occupy only one-half of the available subband width, $2\pi/M$. After a $-\pi/M$ frequency downshift, $X_{even}(\omega)$ (936) is formed.

The subband values $X_{odd}(\omega)$ and $X_{even}(\omega)$ are then combined to form the full-band digital output signal $Y(\omega)$ (950).

Figure 10:
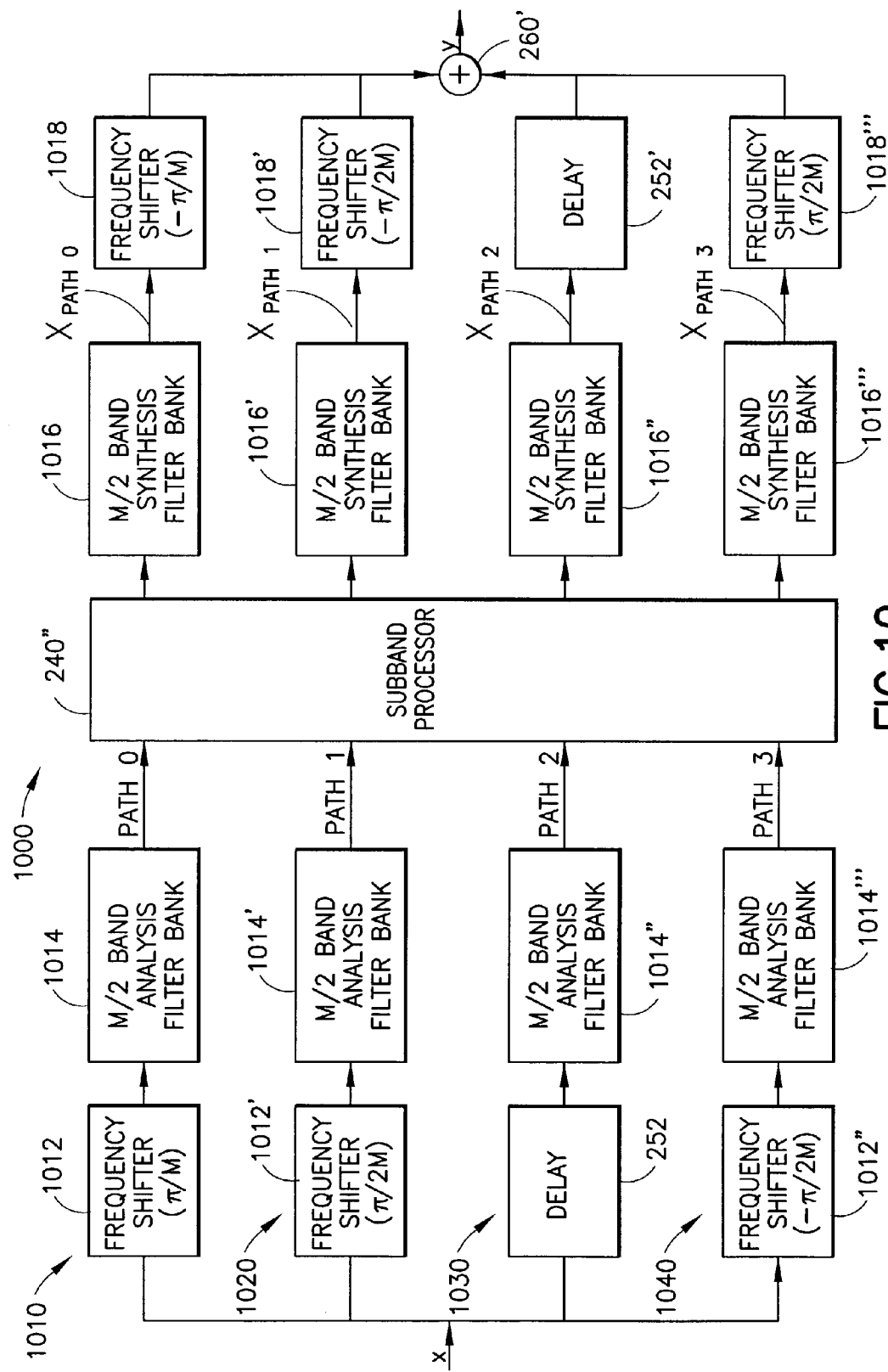
FIG. 10 illustrates a filter structure for one-dimensional filter bank processing with 4×-oversampled filter banks in four subband paths in accordance with the present invention.

FIG. 10 illustrates a 2M-band filter (e.g., four, M/2-band filters) with 4×-oversampled filter banks with four subband paths in accordance with the present invention.

The filter structure 1000 includes four subband processing paths, i.e., Path 0 (1010), Path 1 (1020), Path 2 (1030), and Path 3 (1040). Path 0 (1010) includes a $\pi/M$ frequency shifter 1012, an M/2-band analysis filter bank 1014, an M/2-band synthesis filter 1016, and a $-\pi/M$ frequency shifter 1018. Each synthesis filter bank receives corresponding data from the subband processor 240". Path 1 (1020) includes a $\pi/2M$ frequency shifter 1012', an M/2-band analysis filter bank 1014', an M/2-band synthesis filter 1016', and a $-\pi/2M$ frequency shifter 1018'.

Note that the frequency shift functions described herein can be implemented as discussed previously (e.g., in connection with FIGS. 4(a), 4(b), 5 and 6) with modification as required for the magnitude and direction of frequency shift.

Path 2 (1030) includes a delay 252, an M/2-band analysis filter bank 1014", an M/2-band synthesis filter 1016", and a delay 252'. The delay 252 compensates for the processing time of the frequency shifters 1012, 1012', and 1012", while the delay 252' compensates for the processing time of the frequency shifters 1018, 1018', and 1018".

Path 3 (1040) includes a $-\pi/2M$ frequency shifter 1012", an M/2-band analysis filter bank 1014", an M/2-band synthesis filter 1016", and a $\pi/2M$ frequency shifter 1018".

With this scheme, each successive subband is processed in a successive one of the Paths 1010, 1020, 1030, or 1040. For example, assuming 32 subbands are used, i.e., numbered SB0-SB31, SB0, SB4, SB8, . . . are processed in Path 0 (1010), SB1, SB5, SB9, . . . are processed in Path 1 (1020), SB2, SB6, SB10, . . . are processed in Path 2 (1030), and SB3, SB7, SB11, . . . are processed in Path 3 (1040).

The filter 1000 could optionally be modified to use one or two complex filters, instead of four real filters, based on the discussion of FIG. 2(c).

FIG. 11(a) illustrates the subband structure for Path 0 of the filter bank of FIG. 10 in accordance with the present invention.

The pass bands 1112, 1116, 1120, . . . of the 4× oversampled subbands SB0*, SB0, SB4, SB8, . . . occupy only about one-fourth of the available bandwidth, $2\pi/M$. The corresponding idealized pass bands are shown at 1112', 1116', 1120', . . . , respectively. Specifically, only about $\pi/2M$ radians is occupied by each subband, which leaves a substantial region with little signal energy around the band edges 1110, 1114, 1118, . . . Therefore, little or negligible aliasing between subbands is introduced by the filter structure 1000.

$X_{Path-0}(\omega)$ designates the signal in Path 0 (1010), as shown in FIG. 10.

A similar result is achieved for the other subbands, as discussed below.

Generally, a primary benefit of 4× oversampling that there is even less of a chance of aliasing than with 2× oversampling. The present inventor has found that −40 dB attenuation at the band edges is more than enough for most practical purposes. However, there may be cases where the application demands even more attenuation. One way to achieve this is to increase the prototype filter order and trade off temporal resolution. The second way, discussed here, is to use an even higher oversampling ratio, which results in more significant filter rolloff at the band edges.

FIG. 11(b) illustrates the subband structure for Path 1 of the filter bank of FIG. 10 in accordance with the present invention.

Here, pass bands 1132, 1136, 1140, 1144, . . . of the 4× oversampled subbands SB1*, SB1, SB5, SB9, . . . are provided, with band edges 1130, 1134, 1138, . . . The corresponding idealized pass bands 1132', 1136', 1140', 1144', . . . are also shown.

$X_{Path-1}(\omega)$ designates the signal in Path 1 (1020), as shown in FIG. 10.

FIG. 11(c) illustrates the subband structure for Path 2 of the filter bank of FIG. 10 in accordance with the present invention.

Here, pass bands 1152, 1156, 1160, . . . of the 4× oversampled subbands SB2, SB6, SB10, . . . are provided, with band edges 1150, 1154, 1158, . . . The corresponding idealized pass bands 1152', 1156', 1160', . . . are also shown.

$X_{Path-2}(\omega)$ designates the signal in Path 2 (1030), as shown in FIG. 10.

FIG. 11(d) illustrates the subband structure for Path 3 of the filter bank of FIG. 10 in accordance with the present invention.

Here, pass bands 1182, 1186, . . . of the 4× oversampled subbands SB2, SB6, SB10, . . . are provided, with band edges 1180, 1184, 1188, . . . The corresponding idealized pass bands 11821', 11861', are also shown.

$X_{Path-3}(\omega)$ designates the signal in Path 3 (1040), as shown in FIG. 10.

Figure 12A:
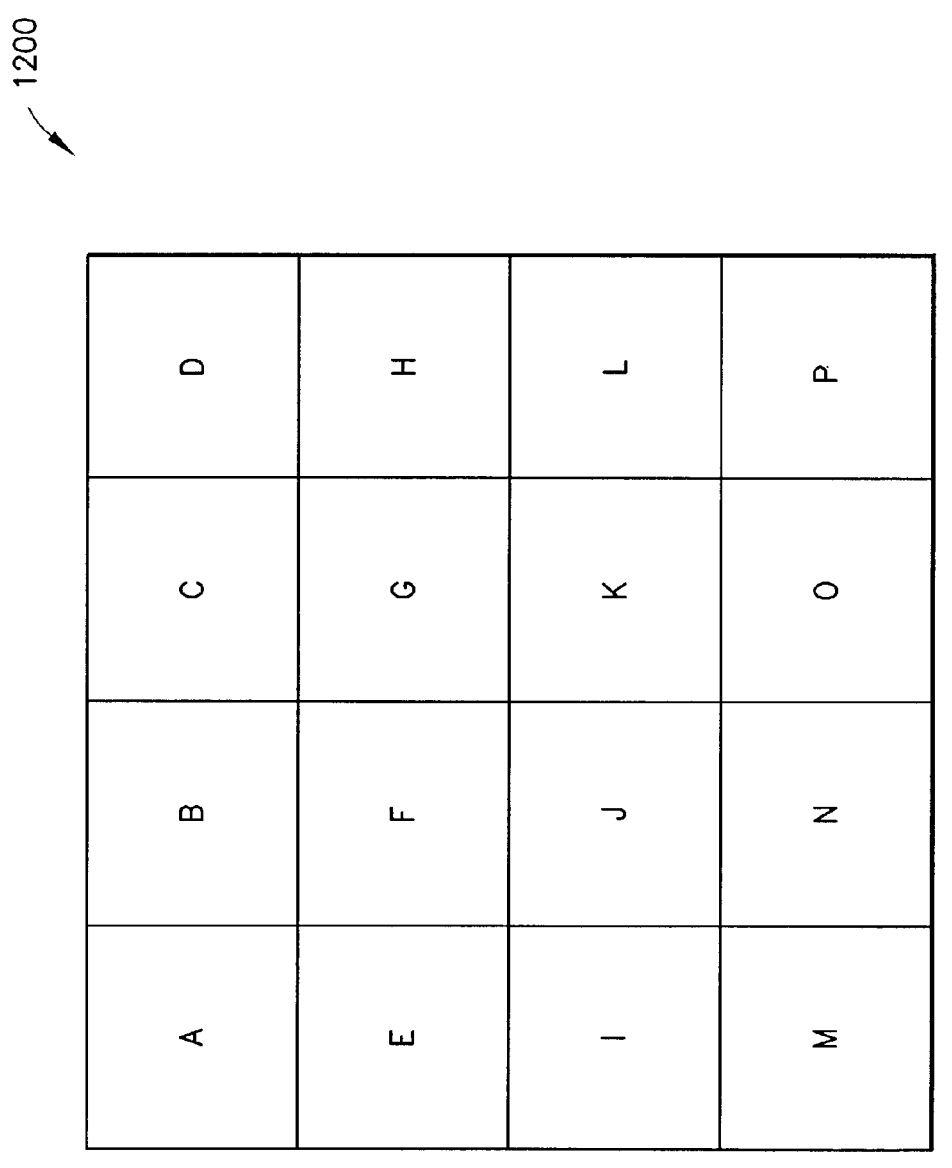
Figure 12B:
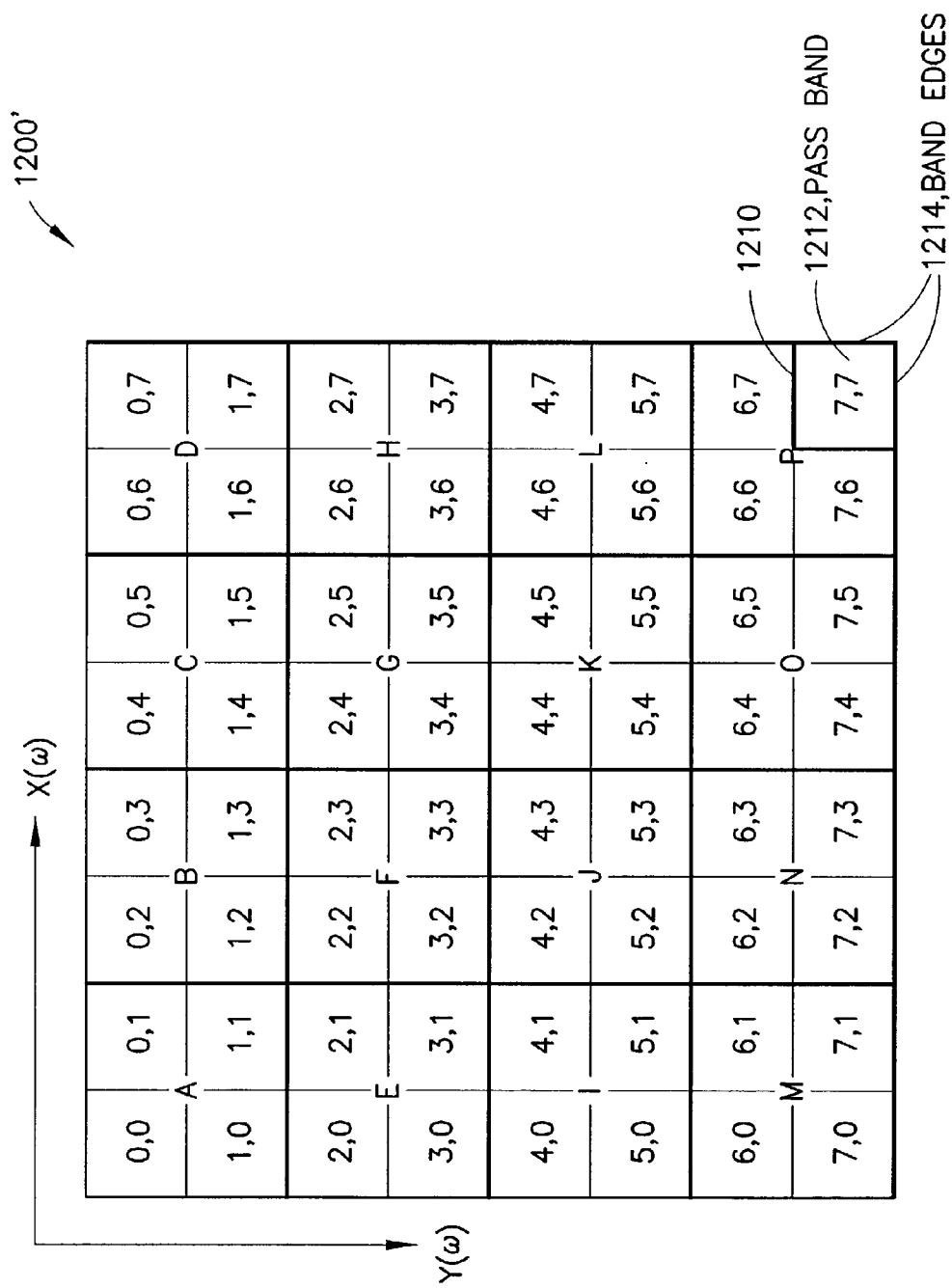
FIG. 12(b) provides a graphical depiction of a conventional 2-D, critically-sampled filter bank.

FIG. 12(a) illustrates an original 2-D signal (image) region with several subregions for processing in accordance with the present invention.

The image 1200 is shown as including a number of subregions A-P. Typically, image data is processed by subdividing it into several blocks, each of which includes many pixels. A block-based spatial transform, such as the Discrete Cosine Transform (DCT) is often used, to provide frequency domain coefficients. Other possible transforms include the Discrete Fourier Transform, Karhunen-Loeve Transform, Walsh Hadamard Transform, and wavelet transform, as well as other known transforms.

FIG. 12(*b*) provides a graphical depiction of a conventional 2-D, critically-sampled filter bank.

Note that FIGS. 12(*b*)–13(*e*) are diagrammatic illustrations that show a composite of image data in the frequency domain (such as DCT frequency coefficients or the like) and associated filters.

Each filter in the image/filter composite 1200' is labeled with (x,y) coordinates, and is overlaid on the corresponding image data subregion which it processes. Note that x and y are used to denote horizontal and vertical direction, respectively, and should not be confused with the input or output signals x(n) and y(n). The meaning should be clear from the context.

An 8×8 2-D filter bank is assumed for illustration purposes, although different sizes can be used.

For example, an image subregion 1210 has data that is processed by a filter labeled (7,7). The image data within the subregion 1210, which is part of the larger image subregion "P", is passed through a pass band 1212 of the corresponding filter, while image data beyond the band edges 1214 will not be passed by this filter.

However, the 2-D, critically-sampled filter bank suffers from the same problem of aliasing between subbands as discussed for the 1-D critically sampled filter bank.

Figures 13A, 13B:
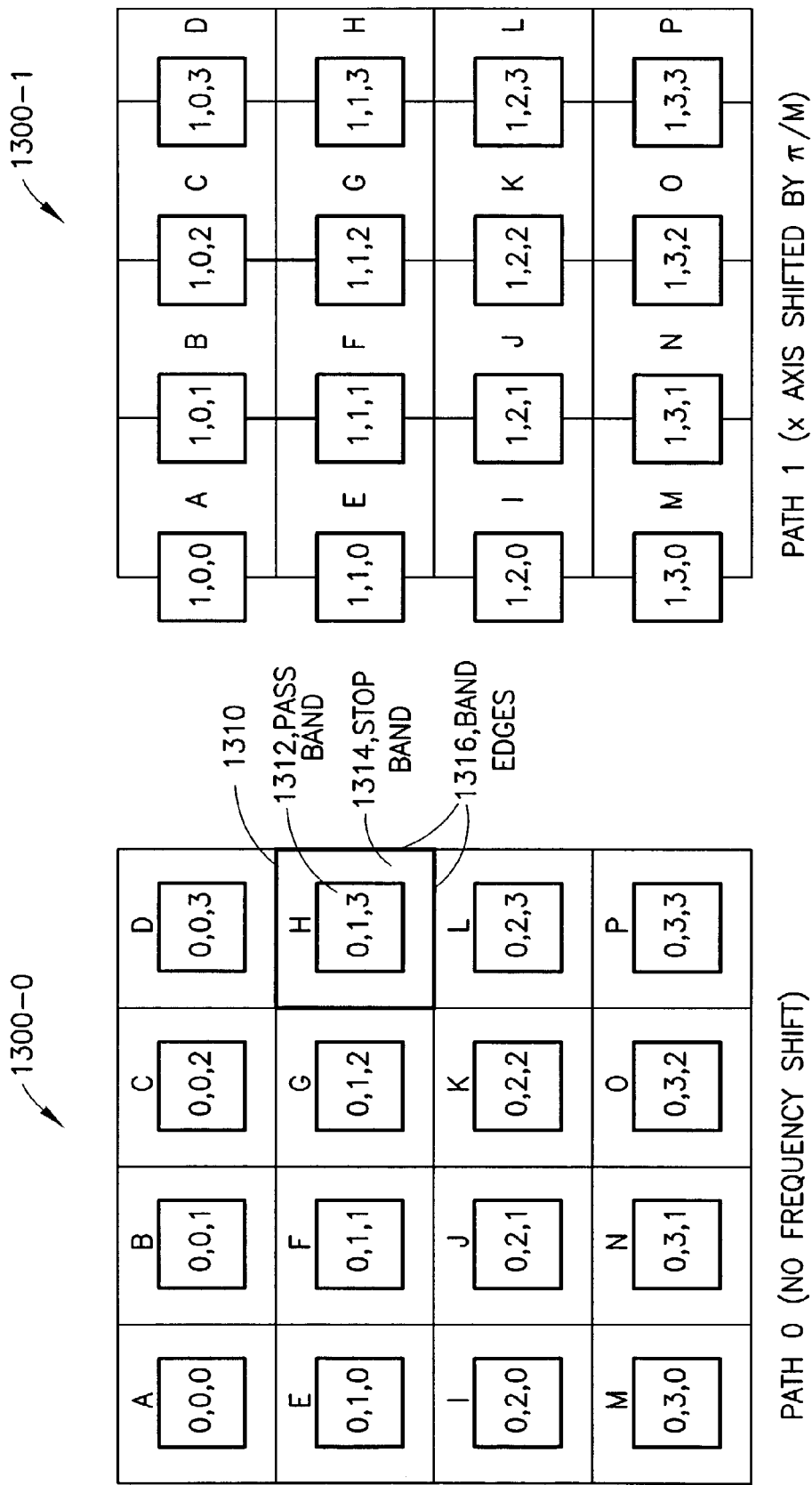
FIG. 13(a) provides a graphical depiction of a path with no frequency shift (Path 0) in a 2-D, over-sampled filter bank in accordance with the present invention.
FIG. 13(b) provides a graphical depiction of a path with a horizontal frequency shift (Path 1) in a 2-D, over-sampled filter bank in accordance with the present invention.
Figure 13D:
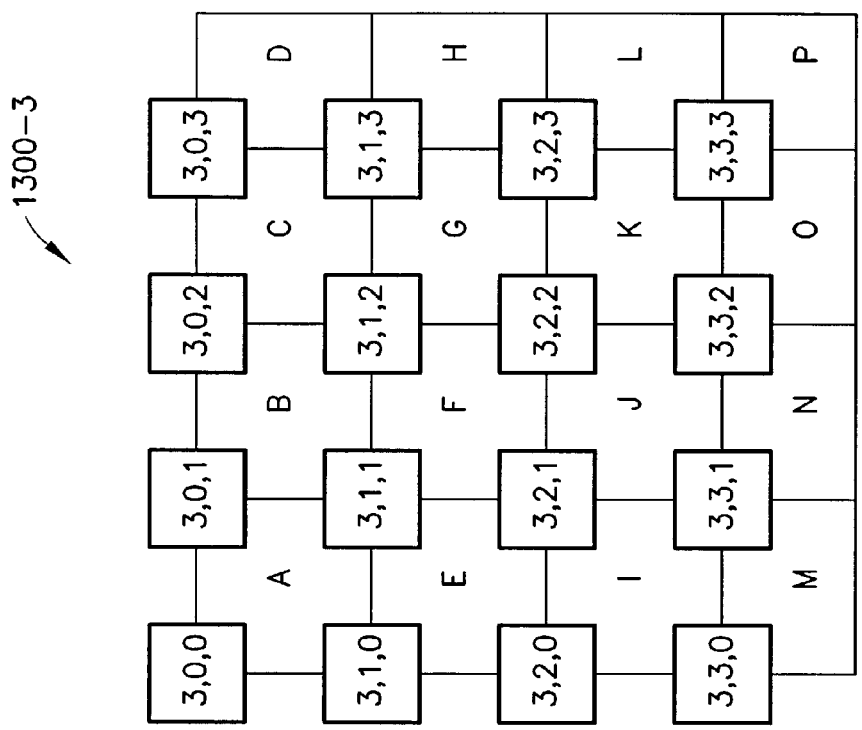
FIG. 13(d) provides a graphical depiction of a path with horizontal and vertical frequency shifts (Path 3) in a 2-D, over-sampled filter bank in accordance with the present invention.
Figure 13C:
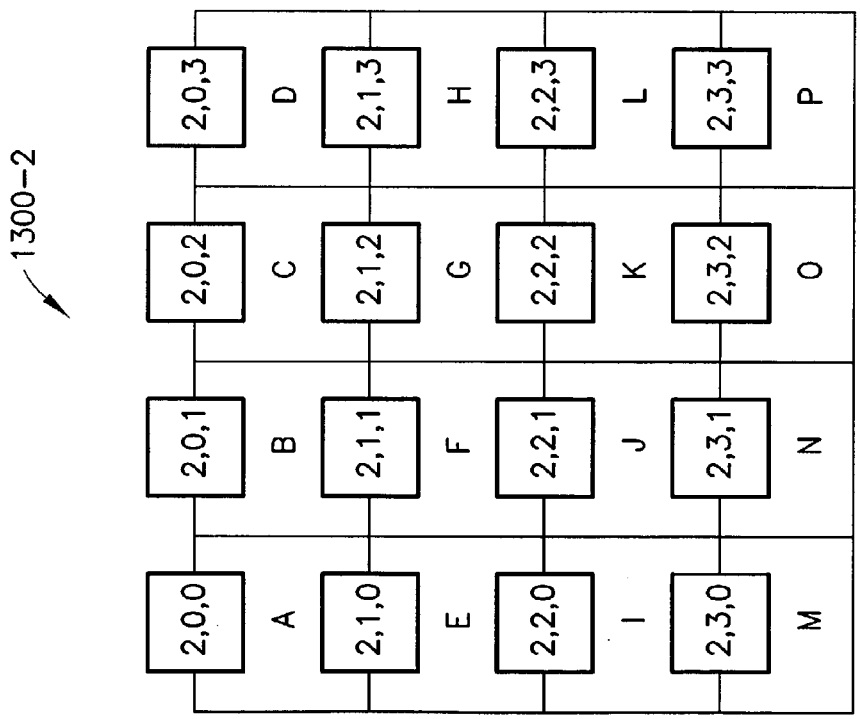
FIG. 13(c) provides a graphical depiction of a path with a vertical frequency shift (Path 2) in a 2-D, over-sampled filter bank in accordance with the present invention.

FIG. 13(*a*) provides a graphical depiction of a path with no frequency shift (Path 0) in a 2-D, over-sampled filter bank in accordance with the present invention.

Figures 14, 14A:
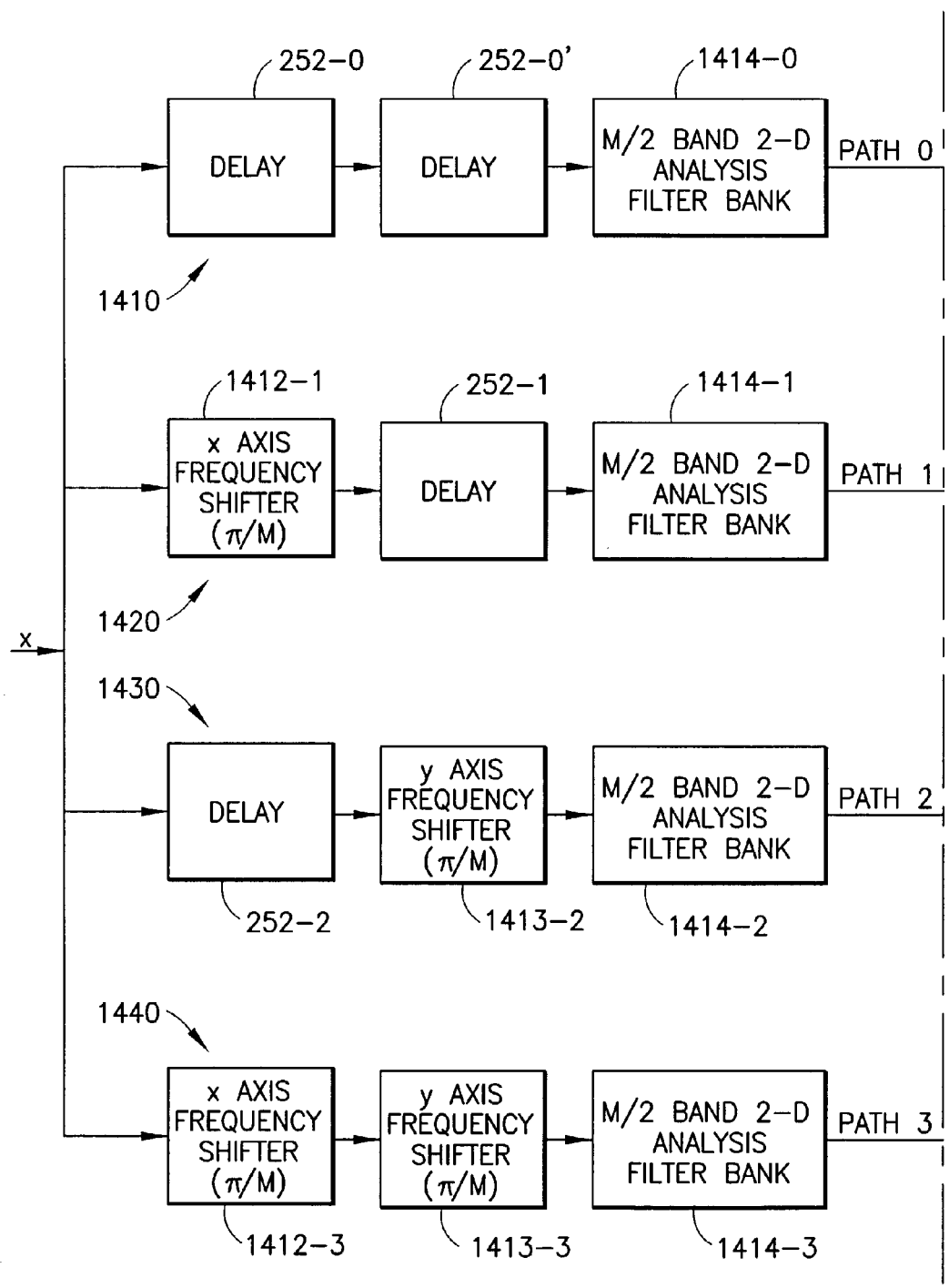
FIG. 14 illustrates a real filter structure for two-dimensional filter bank processing with 2×-oversampled real filter banks in four subband paths in accordance with the present invention.
Figure 14B:
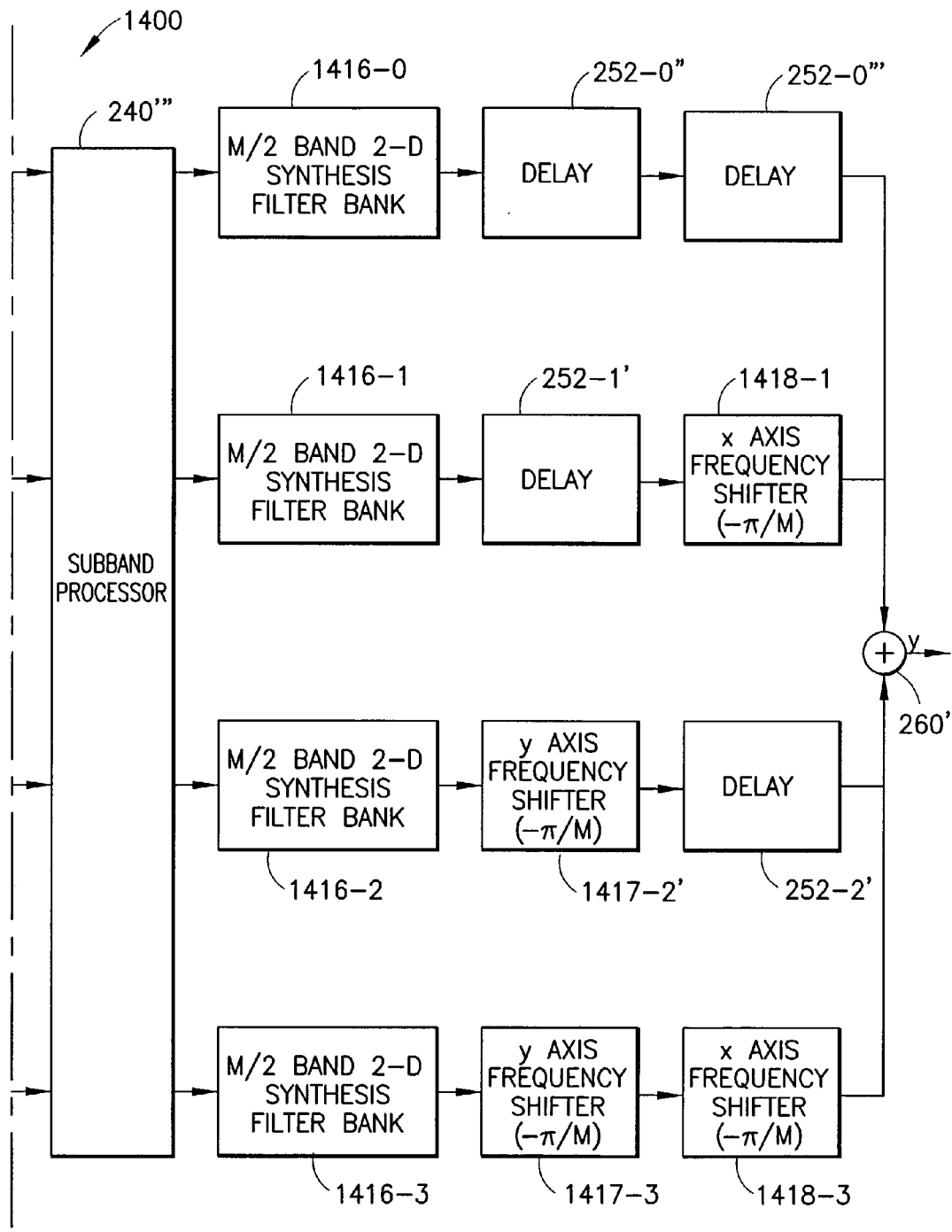

As explained further in connection with FIG. 14, a 2× oversampled 2-D filter bank structure in accordance with the present invention processes image or other 2-D data in four processing paths, namely Paths 0–3.

In a particular embodiment, the 2-D data toward the center of each image region is processed in the first path, Path 0, while data at vertical boundaries between regions (x-axis shifted by $_\pi/M$) is processed in a second path, Path-1, data at horizontal boundaries between regions (y-axis shifted by $_\pi/M$) is processed in a third path, Path-2, and data at corners of the boundaries between regions (x-axis and y-axis shifted by $_\pi/M$) is processed in a fourth path, Path-3.

Here, each filter is labeled with (P,x,y) coordinates in the image/filter composite 1300-0, where the "P" coordinate denotes the path, and is shown overlaid with the corresponding image data subregion. For example, an image subregion 1310, labeled "H", has data that is processed by an oversampled filter (0,1,3).

The image data toward the center of the subregion 1310 will pass through a pass band 1312 of the corresponding filter essentially unchanged, while data between the pass band 1312 and band edges 1316 is stopped by a stop band 1314.

FIG. 13(*b*) provides a graphical depiction of a path with a horizontal frequency shift (Path 1) in a 2-D, over-sampled filter bank in accordance with the present invention.

In this path, the image/filter composite 1300-1 shows that data at vertical boundaries between regions (x-axis shifted by $_\pi/M$) is processed using the corresponding filters as shown. For example, data between the regions "A" and "B" is processed using a filter with index (1,0,1).

FIG. 13(*c*) provides a graphical depiction of a path with a vertical frequency shift (Path 2) in a 2-D, over-sampled filter bank in accordance with the present invention.

In this path, the image/filter composite 1300-2 shows that data at horizontal boundaries between regions (y-axis shifted by $_\pi/M$) is processed using the corresponding filters as shown. For example, data between the regions "A" and "E" is processed using a filter with index (2,1,0).

FIG. 13(*d*) provides a graphical depiction of a path with horizontal and vertical frequency shifts (Path 3) in a 2-D, over-sampled filter bank in accordance with the present invention.

In this path, the image/filter composite 1300-3 shows that data at corners of the boundaries between regions (x-axis and y-axis shifted by $_\pi/M$) is processed in a fourth path. For example, data at the corner of regions "A", "B", "E" and "F" is processed using a filter with index (3,1,1).

FIG. 13(*e*) provides a graphical depiction of the frequency regions that are processed in FIGS. 13(*a*)–13(*d*) in a 2-D, over-sampled filter bank in accordance with the present invention.

The image/filter composite 1300 shows the aggregation of the 2-D data regions that are processed by each of the four paths. In the example shown, sixteen regions are processed in each path, for a total of sixty-four regions.

A region 1385 illustrates an area of imperfect reconstruction by the filter banks. Thus, by summing the regions from FIGS. 13(*a*), (*b*), (*c*) and (*d*), we find that the area 1385 is not covered by any of the four paths. To obtain complete coverage, additional processing paths can be introduced. This is similar to the 1-D case, where we decided to drop the last subband. Notice that the area 1385 corresponds to high-frequency regions of the 2-D signal, so, for most applications, this data is not used at all and can be discarded without noticeably impairing the resulting output signal quality.

Generally, the present invention can be extended to an oversampled filter bank structure for use with N-dimensions. For illustration purposes, an example of a 2-D oversampled filter bank has been shown. Such a filter bank can be used, e.g., in applications relating to video or image processing.

FIG. 14 illustrates a real filter structure for two-dimensional filter bank processing with 2×-oversampled real filter banks in four subband paths in accordance with the present invention.

Note that the frequency shift functions described herein can be implemented as discussed previously (e.g., in connection with FIGS. 4(*a*), 4(*b*), 5 and 6) with modification as required for the magnitude and direction of frequency shift.

Additionally, the filter structure can be modified to used one or more complex filters as discussed in connection with FIG. 2(*c*).

The filter structure 1400 includes processing paths 1410, 1420, 1430 and 1440. Generally, a number of delay elements (in path 0: 252-0, 252-0', 252-0", 252-0'''; in path 1: 252-1, 252-1'; and, in path 2: 252-2, 252-2') are provided to compensate for the processing time of the functions that are shown as vertically aligned in the figure.

Each path includes an analysis filter bank 1414-0, 1414-1, 1414-2 and 1414-3, and a corresponding synthesis filter bank 1416-0, 1416-1, 1416-2 and 1416-3, which receives the corresponding data from the subband processor 240'''.

Path 1 (1420) includes counterpart x-axis frequency shifters 1412-1 and 1418-1, while Path 2 (1430) includes counterpart y-axis frequency shifters 1413-2 and 1417-2, and Path 3 (1440) includes both counterpart x-axis frequency shifters 1412-3 and 1418-3, and counterpart y-axis frequency shifters 1413-3 and 1417-3.

A combiner 260' receives the output in each path to provide the final output signal y(n). Again, the x-axis and y-axis terminology should not be confused with the input signal x(n) and output signal y(n).

Note that the x-axis (1412-1, 1412-3) and y-axis (1413-2, 1413-3) shift functions can use common hardware and/or software.

Accordingly, it can be seen that the present invention provides an oversampled filter bank structure that can be implemented using popular and efficient fast filter banks. Advantageously, aliasing between subbands is substantially reduced, thus allowing the independent processing of the subband signals using any known subband processing technique. For example, an input audio or video signal may be processed to embed auxiliary data in its subbands. The auxiliary data may be used for any number of purposes, such as copyright protection, broadcast verification, identification of soundtrack, carrying electronic coupon data, and so forth. Moreover, equalizing and noise shaping of the subbands as well as other processing may be provided.

Additionally, the oversampled filter bank can be used in OFDM, which has found application in Digital Subscriber Loop (DSL) and digital broadcast systems.

In a particular embodiment, even subbands of an input signal are frequency-shifted prior to filtering and subband processing, while the odd subbands are delayed to compensate for the processing time of the frequency shifting. Separate analysis and synthesis filter banks may be provided for the even and odd subbands, or the subbands may be processed together in a single complex filter bank.

2× oversampling may be advantageously used in the filter banks.

Frequency shifting may be achieved using critically-sampled cosine filter banks, or a Hilbert transform, for example.

In an optional embodiment, the subbands are processed in four subband paths, and 4× oversampling is used at the filter banks. The invention may also be extended to two-dimensional or higher filtering applications.

Moreover, the invention can be extended to multi-dimensional applications. For example, a 2-D oversampled filter bank structure is shown that processes data in four paths, three of which undergo frequency shifts. The structure is suited for processing image or other 2-D data, such as seismic or other vibrational data, temperature data and the like.

The invention can be extended using the principles shown to additional dimensions.

Although the invention has been described in connection with various specific embodiments, those skilled in the art will appreciate that numerous adaptations and modifications may be made thereto without departing from the spirit and scope of the invention as set forth in the claims.

For example, known computer hardware, firmware and/or software techniques may be used to implement the invention.

Also, the digital input signal discussed herein may only be a portion of an overall signal that is provided at some upstream location. Only a portion of the overall signal need be processed in accordance with the invention. Additionally, the system of the invention may be aggregated to process additional input signals, or additional portions of an input signal.

What is claimed is:

1. A digital filter apparatus for processing a digital input signal, comprising:
    oversampled analysis filter bank means for filtering at least a first and second plurality of subbands of said digital input signal according to an oversampling ratio; and
    a first frequency shifter for frequency-shifting the first plurality of subbands of said digital input signal to provide corresponding frequency-shifted subbands for filtering by said filter bank means;
    wherein:
    said second plurality of subbands are distinct from said first plurality of subbands; and
    the oversampling ratio is selected to reduce aliasing between adjacent ones of the subbands.

2. The apparatus of claim 1, wherein:
    the oversampling ratio is 2:1.

3. The apparatus of claim 1, wherein:
    said filter bank means comprises at least one comb filter.

4. The apparatus of claim 1, wherein:
    said filter bank means outputs M subbands, where $M \geq 8$.

5. The apparatus of claim 1, wherein:
    said first plurality of subbands comprise even-numbered subbands of said digital input signal; and
    said second plurality of subbands comprise odd-numbered subbands of said digital input signal.

6. The apparatus of claim 1, wherein:
    said first frequency shifter comprises critically-sampled cosine-modulated analysis and synthesis filter banks.

7. The apparatus of claim 1, wherein:
    said first frequency shifter comprises a Hilbert transformer.

8. The apparatus of claim 1, further comprising:
    first and second parallel paths for carrying said digital input signal to said filter bank means;
    wherein said first frequency shifter is provided in said first path; and
    a first delay is provided in said second path for delaying the second plurality of subbands to compensate for a delay caused by a processing time of said first frequency shifter.

9. The apparatus of claim 8, wherein:
    said filter bank means comprises a first oversampled analysis filter bank arranged in said first path for filtering said frequency-shifted subbands, and a second oversampled analysis filter bank arranged in said second path for filtering the delayed subbands.

10. The apparatus of claim 9, wherein:
    said first and second analysis filter banks comprise respective M/2-band filter banks, and M is the number of subbands output from the filter bank means.

11. The apparatus of claim 1, further comprising:
    a subband processor for processing the frequency-shifted subbands and the second plurality of subbands after filtering thereof.

12. The apparatus of claim 11, further comprising:
    oversampled synthesis filter means for filtering said frequency-shifted subbands after processing thereof at said subband processor, and for filtering said second plurality of subbands after processing thereof at said subband processor.

13. The apparatus of claim 12, further comprising:
    a second frequency shifter for frequency-shifting said frequency-shifted subbands after filtering thereof at said synthesis filter means in a shift direction opposite to a shift direction of said first frequency shifter.

14. The apparatus of claim 13, wherein:
said first frequency shifter provides a frequency upshift, and said second frequency shifter provides a corresponding frequency down shift.

15. The apparatus of claim 13, further comprising:
a second delay for delaying the second plurality of subbands to compensate for a delay of said second frequency shifter.

16. The apparatus of claim 12, further comprising:
a combiner for combining said frequency-shifted subbands after filtering thereof at said synthesis filter means, with said second plurality of subbands after filtering thereof at said synthesis filter means, to provide a digital output signal corresponding to said digital input signal.

17. The apparatus of claim 12, wherein:
said synthesis filter means comprises a first oversampled synthesis filter bank for synthesis filtering said frequency-shifted subbands, and a second oversampled synthesis filter bank for synthesis filtering said second plurality of subbands.

18. The apparatus of claim 17, wherein:
said first and second oversampled synthesis filter banks comprise respective comb filters.

19. The apparatus of claim 1, wherein:
said first frequency shifter provides a $\pi/M$ radian frequency shift; and
M is the number of subbands output from said filter bank means.

20. The apparatus of claim 1, wherein said first frequency shifter comprises:
a cosine-modulated analysis filter bank for processing the first plurality of subbands;
means for providing frequency axis reversal for the subbands output from the cosine-modulated analysis filter bank; and
a cosine-modulated synthesis filter bank for processing the subbands output from the frequency axis reversal means to provide the frequency-shifted subbands.

21. The apparatus of claim 1, wherein said first frequency shifter comprises:
a cosine-modulated analysis filter bank for processing the first plurality of subbands;
a cosine-modulated synthesis filter bank for processing the subbands output from the cosine-modulated analysis filter bank to provide the frequency-shifted subbands; and
means for feeding a highest subband that is output from the cosine-modulated analysis filter bank to a lowest subband input of the cosine-modulated synthesis filter bank.

22. The apparatus of claim 1, wherein said filter bank means comprises a complex filter bank, further comprising:
a delay for delaying the second plurality of subbands to compensate for a delay of said first frequency shifter; and
means for forming a complex signal comprising a real portion obtained from the frequency-shifted subbands, and an imaginary portion obtained from the delayed subbands; and
means for providing the complex signal to the complex filter bank for filtering thereat.

23. The apparatus of claim 1, wherein:
said oversampled analysis filter bank means is adapted to filter additional subbands of said digital input signal, including at least a third and fourth plurality of subbands of said digital input signal according to the oversampling ratio; wherein:
said third plurality of subbands are distinct from said fourth plurality of subbands.

24. The apparatus of claim 23, wherein:
said oversampling ratio is 4:1.

25. The apparatus of claim 23, further comprising:
first, second, third and fourth parallel paths for providing said digital input signal to said analysis filter bank means;
the first frequency shifter being provided in said first path for frequency-shifting said first plurality of subbands;
a second frequency shifter in said second path for frequency-shifting said second plurality of subbands;
a third frequency shifter in said fourth path for frequency-shifting said third plurality of subbands; and
a delay in said third path for delaying said fourth plurality of subbands to compensate for a processing time of said first, second and third frequency-shifters.

26. The apparatus of claim 25, wherein:
said first frequency shifter provides a $\pi/M$ radian frequency shift;
said second frequency shifter provides a $\pi/2M$ radian frequency shift;
said third frequency shifter provides a $-\pi/2M$ radian frequency shift; and
2M is the number of subbands output from the oversampled analysis filter bank means.

27. The apparatus of claim 25, wherein:
said analysis filter bank means comprises M/2-band oversampled filter banks for each of said first, second, third and fourth paths, and 2M is the number of subbands output from the oversampled analysis filter bank means.

28. The apparatus of claim 27, wherein:
said M/2-band oversampled filter banks comprise comb filters.

29. A digital filter apparatus for processing a digital input signal, comprising:
oversampled analysis filter bank means for filtering at least a first and second plurality of subbands of said digital input signal according to an oversampling ratio;
said second plurality of subbands are distinct from said first plurality of subbands;
the oversampling ratio is selected to reduce aliasing between adjacent ones of the subbands;
said oversampled analysis filter bank means is adapted to filter additional subbands of said digital input signal, including at least a third and fourth plurality of subbands of said digital input signal according to the oversampling ratio;
said third plurality of subbands are distinct from said fourth plurality of subbands;
wherein the digital input signal comprises two-dimensional data extending along an x-axis and a perpendicular y-axis, further comprising:
first, second, third and fourth parallel paths for providing said digital input signal to said analysis filter bank means;
x-axis frequency shifting means for frequency-shifting said second plurality of subbands in said second path, and said fourth plurality of subbands in said fourth path;

y-axis frequency shifting means for frequency-shifting said third plurality of subbands in said third path, and said fourth plurality of subbands in said fourth path; and delay means for delaying said first plurality of subbands in said first path to compensate for a processing time of said x-axis and y-axis frequency shifting means.

30. The apparatus of claim 29, wherein:

said x-axis and y-axis frequency shifting means provide a magnitude $\pi/M$ radian frequency shift; and 4×M×M is the number of subbands output from the oversampled analysis filter bank means.

31. The apparatus of claim 29, wherein:

said analysis filter bank means comprises M/2-band oversampled filter banks for each of said first, second, third and fourth paths, and 4×M×M is the number of subbands output from the oversampled analysis filter bank means.

32. The apparatus of claim 31, wherein:

said M/2-band oversampled filter banks comprise comb filters.

* * * * *